(12) United States Patent
Yuk et al.

(10) Patent No.: US 11,747,286 B2
(45) Date of Patent: Sep. 5, 2023

(54) LIQUID CHIP FOR ELECTRON MICROSCOPE HAVING EXCELLENT BULGING RESISTANCE

(71) Applicant: KOREA ADVANCED INSTITUTE OF SCIENCE AND TECHNOLOGY, Daejeon (KR)

(72) Inventors: Jongmin Yuk, Daejeon (KR); Namgyu Noh, Daejeon (KR); Kunmo Koo, Daejeon (KR); Jungjae Park, Daejeon (KR); Sanghyeon Ji, Daejeon (KR)

( * ) Notice: Subject to any disclaimer, the term of this patent is extended or adjusted under 35 U.S.C. 154(b) by 626 days.

(21) Appl. No.: 16/749,941

(22) Filed: Jan. 22, 2020

(65) Prior Publication Data
US 2020/0240933 A1 Jul. 30, 2020

(30) Foreign Application Priority Data
Jan. 25, 2019 (KR) .......................... 10-2019-0009589

(51) Int. Cl.
*G01N 23/04* (2018.01)
*B01L 3/00* (2006.01)
(Continued)

(52) U.S. Cl.
CPC ............ *G01N 23/04* (2013.01); *B01L 3/5027* (2013.01); *H01J 37/20* (2013.01); *H01J 37/26* (2013.01);
(Continued)

(58) Field of Classification Search
CPC ............... G01N 23/04; G01N 23/2251; G01N 23/2204; G01N 2223/04; G01N 2223/637;
(Continued)

(56) References Cited

U.S. PATENT DOCUMENTS

| 5,406,087 A * | 4/1995 | Fujiyoshi ................ H01J 37/26 850/18 |
| 2005/0173632 A1* | 8/2005 | Behar ...................... B01L 3/508 250/311 |

(Continued)

FOREIGN PATENT DOCUMENTS

| JP | H07333118 A | 12/1995 |
| JP | 2016110877 A | 6/2016 |
| JP | 2017527808 A | 9/2017 |

*Primary Examiner* — Jason L McCormack
(74) *Attorney, Agent, or Firm* — Harvest IP Law, LLP

(57) ABSTRACT

The present disclosure relates to a fluid chip for an electron microscope including a lower chip, an upper chip, and a fluid channel part for supplying a fluid sample, and may attach a transmissive thin film part of a graphene material having excellent bulging resistance to a plurality of holes formed in a fluid channel part to increase the thickness of a support not serving as a transmissive window thicker than the conventional one, thereby minimizing the loss of a spatial resolution and also suppressing the bulging phenomenon of the transmissive window while supplying the fluid sample more stably.

Further, the present disclosure may form an electrode which may be connected with an external electrical supply source in the fluid channel part, thereby analyzing electrochemical or thermochemical reaction of the fluid sample in the fluid channel part in real time.

11 Claims, 27 Drawing Sheets

(51) Int. Cl.
*H01J 37/20* (2006.01)
*H01J 37/26* (2006.01)

(52) U.S. Cl.
CPC ...... *B01L 2300/12* (2013.01); *G01N 2223/04* (2013.01); *G01N 2223/637* (2013.01); *H01J 2237/2802* (2013.01)

(58) Field of Classification Search
CPC ........ G01N 2223/081; G01N 2223/418; B01L 3/5027; B01L 2300/12; H01J 37/00; H01J 37/02; H01J 37/20; H01J 37/26; H01J 37/16; H01J 2237/2802; H01J 2237/2007
USPC ............. 422/502; 250/306, 307, 311, 440.11
See application file for complete search history.

(56) References Cited

U.S. PATENT DOCUMENTS

| | | | |
|---|---|---|---|
| 2016/0042912 A1 | 2/2016 | Adiga et al. | |
| 2016/0377513 A1* | 12/2016 | Chang | H01J 37/32009 250/428 |
| 2017/0032928 A1* | 2/2017 | Mele | H01J 37/20 |
| 2019/0164720 A1* | 5/2019 | Hsieh | G01N 23/00 |
| 2019/0272972 A1* | 9/2019 | Hsieh | H01J 37/261 |
| 2022/0044906 A1* | 2/2022 | Nakamura | H01J 37/21 |

* cited by examiner

[FIG. 1]
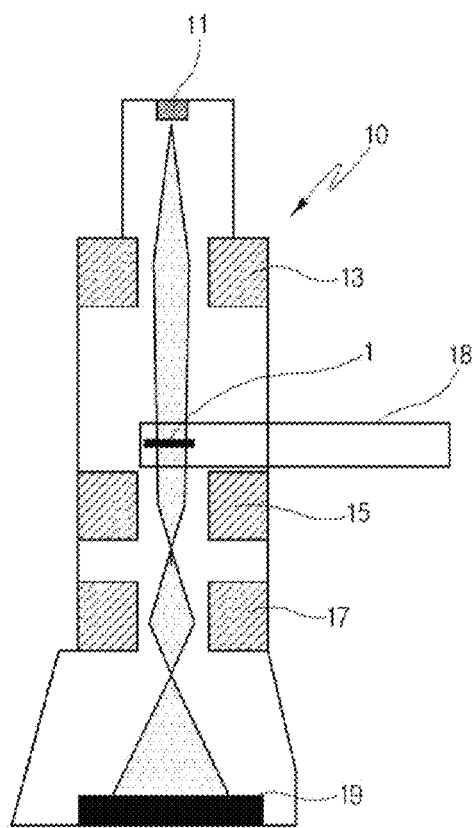

[FIG. 2]
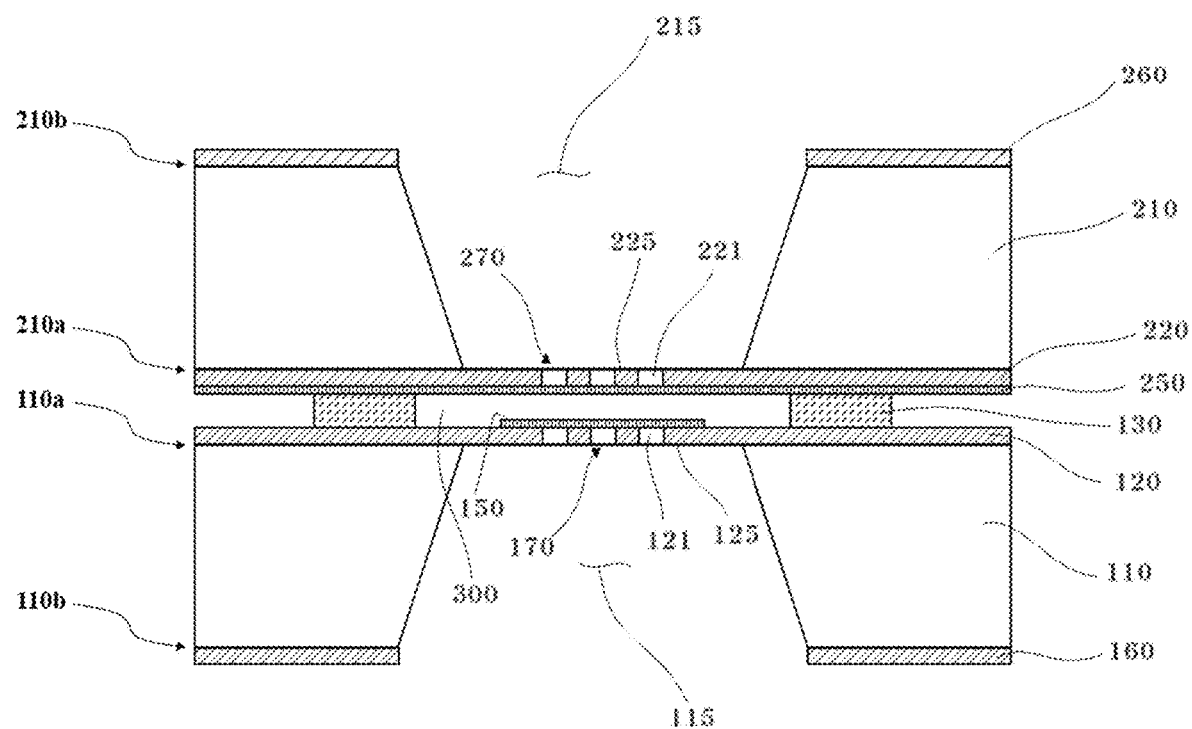

[FIG. 3]
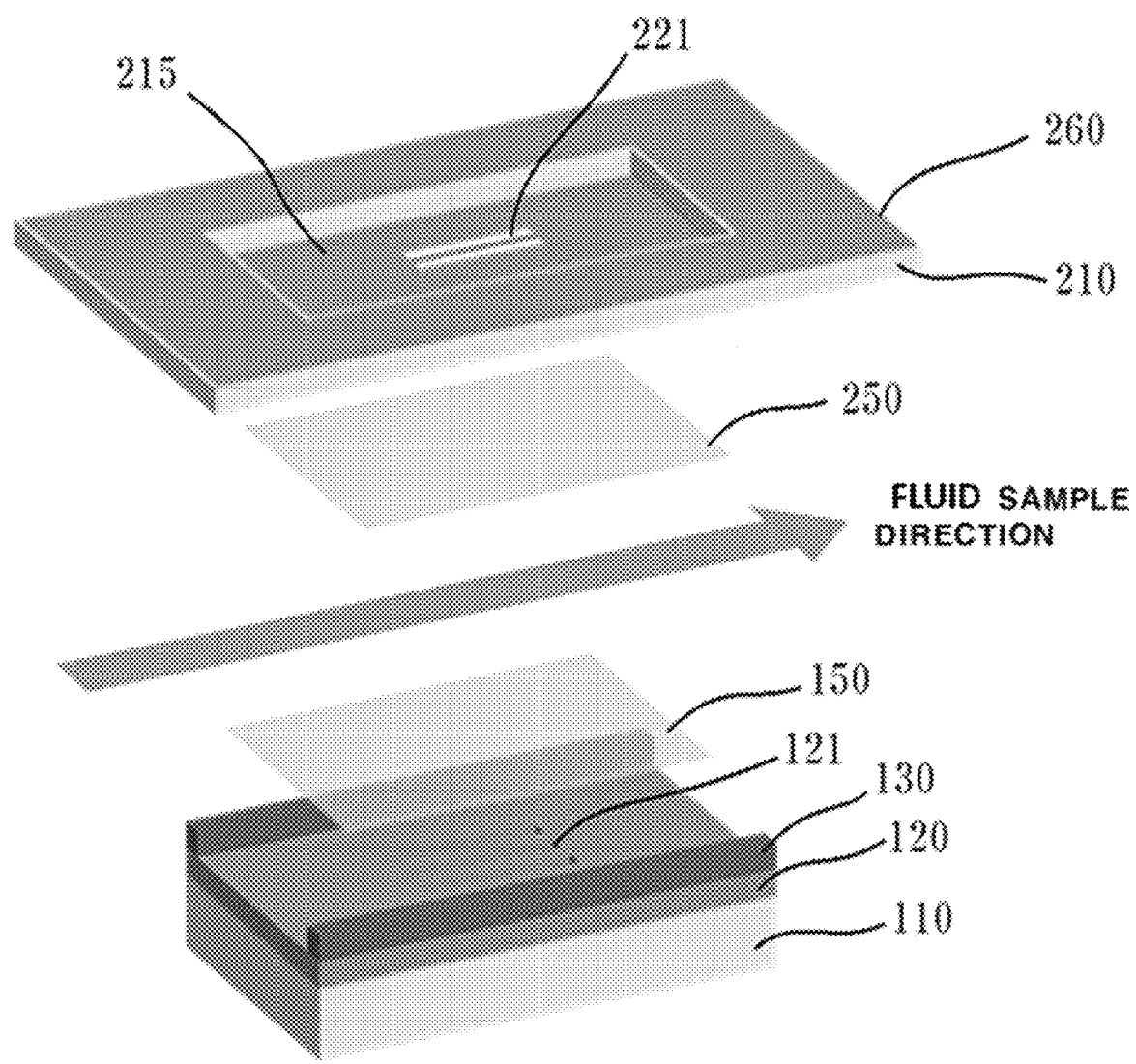

[FIG. 4]
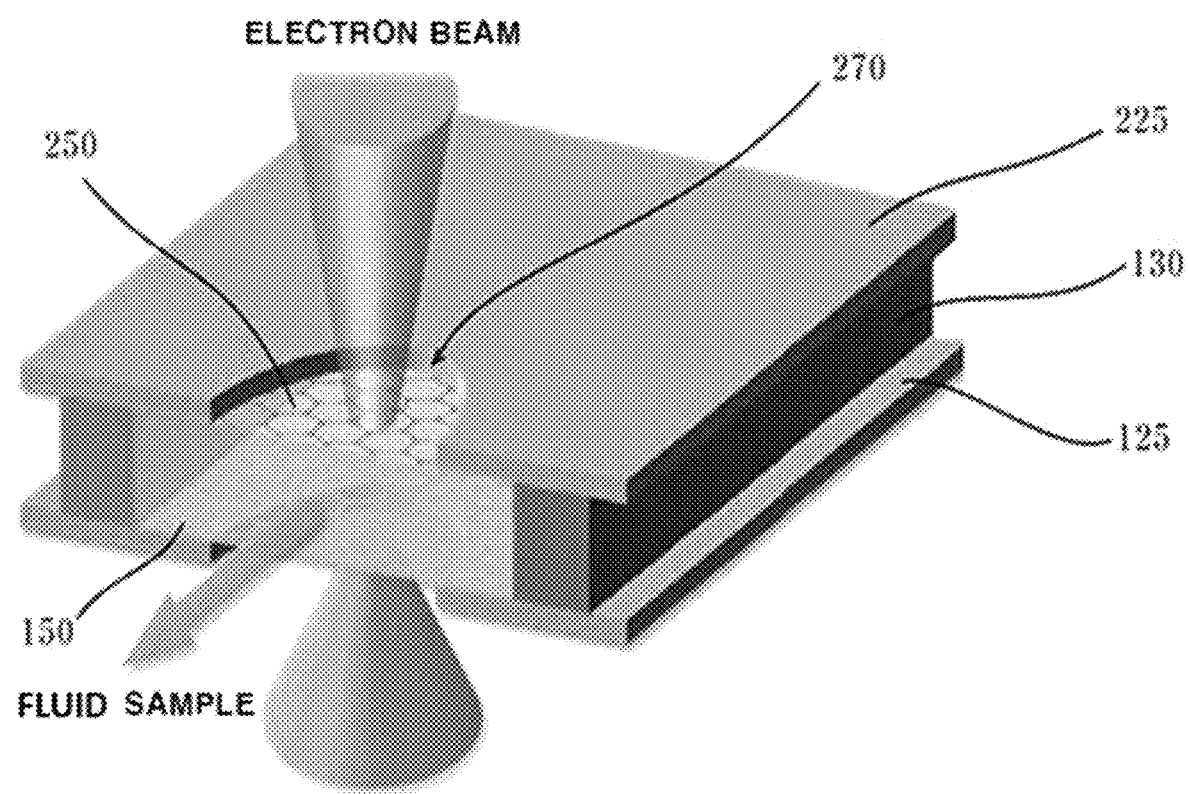

[FIG. 5]
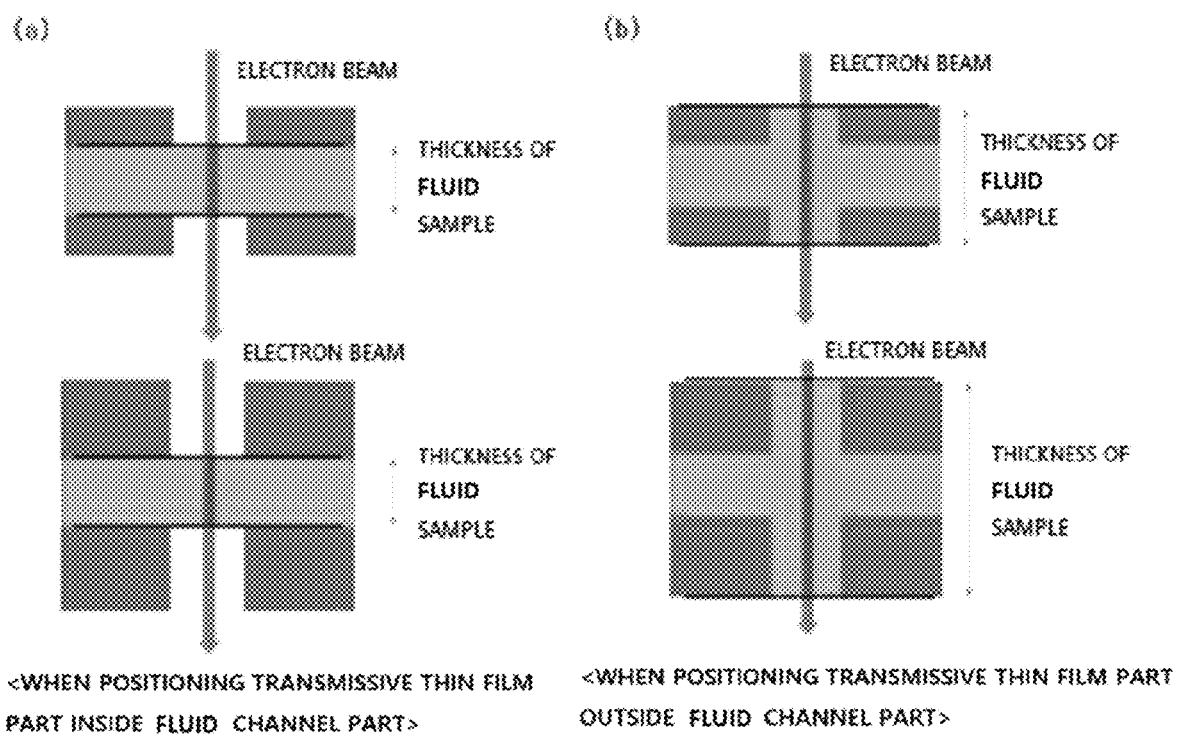

[FIG. 6]
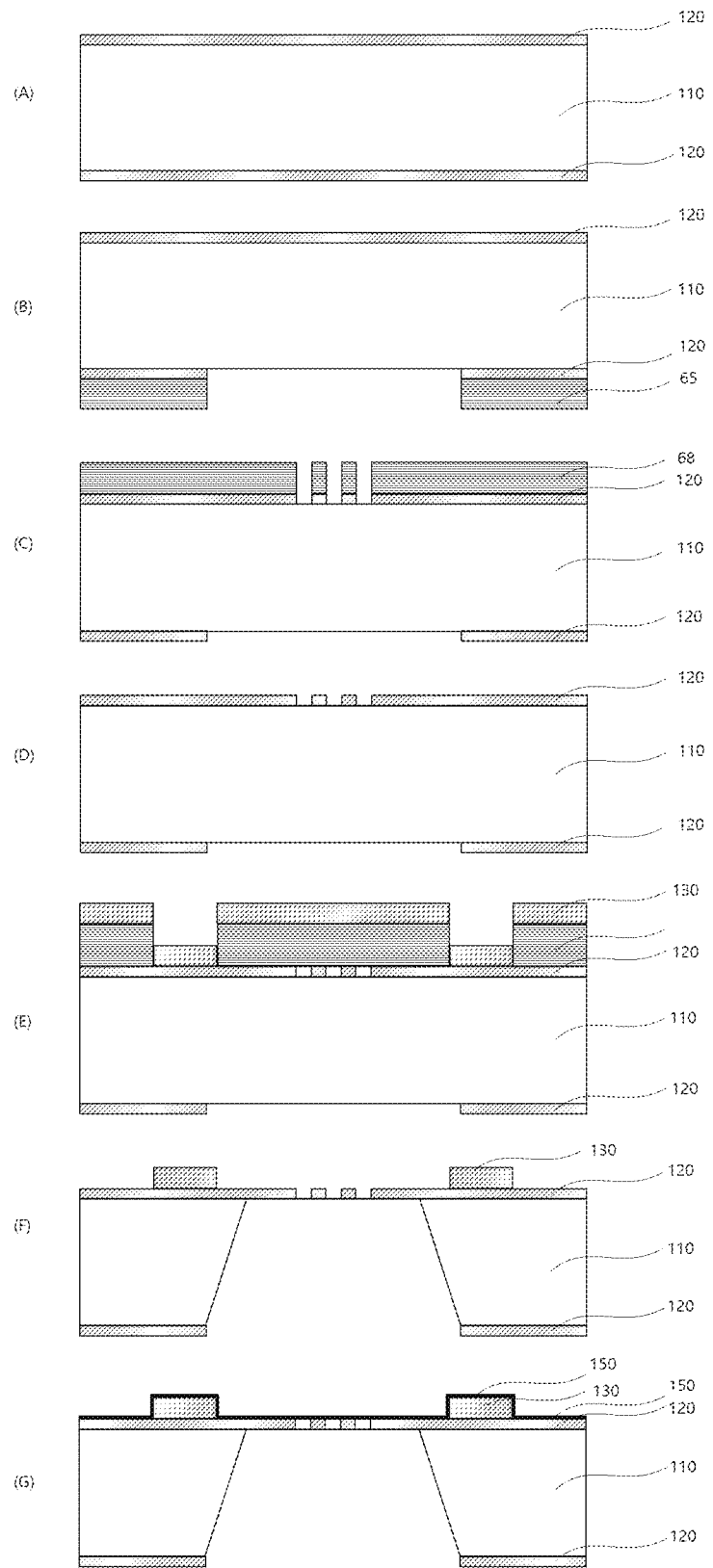

[FIG. 7]
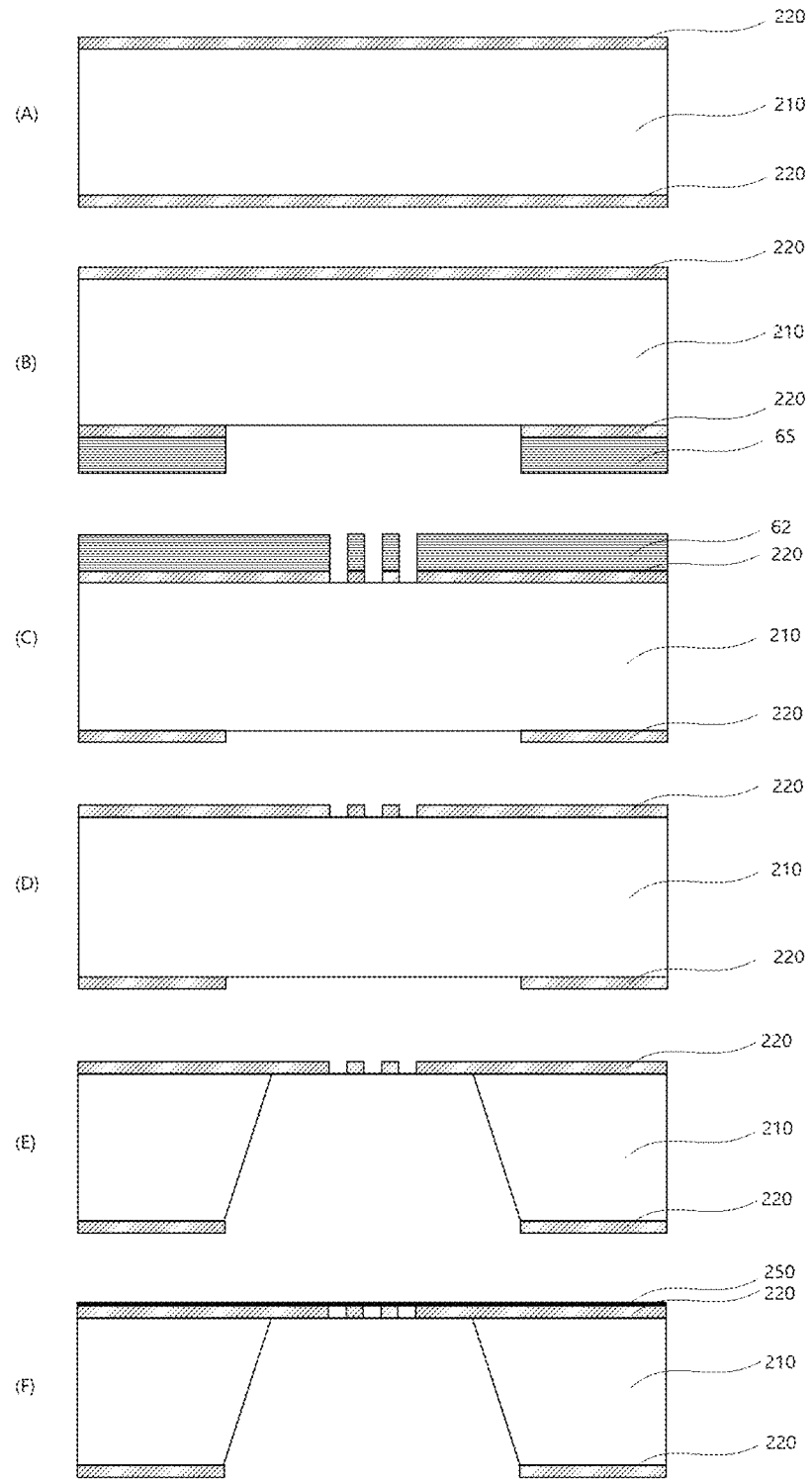

[FIG. 8]
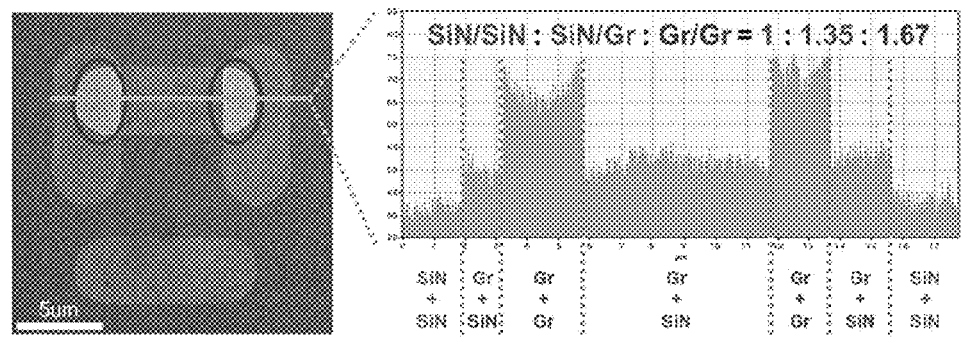
[FIG. 9]
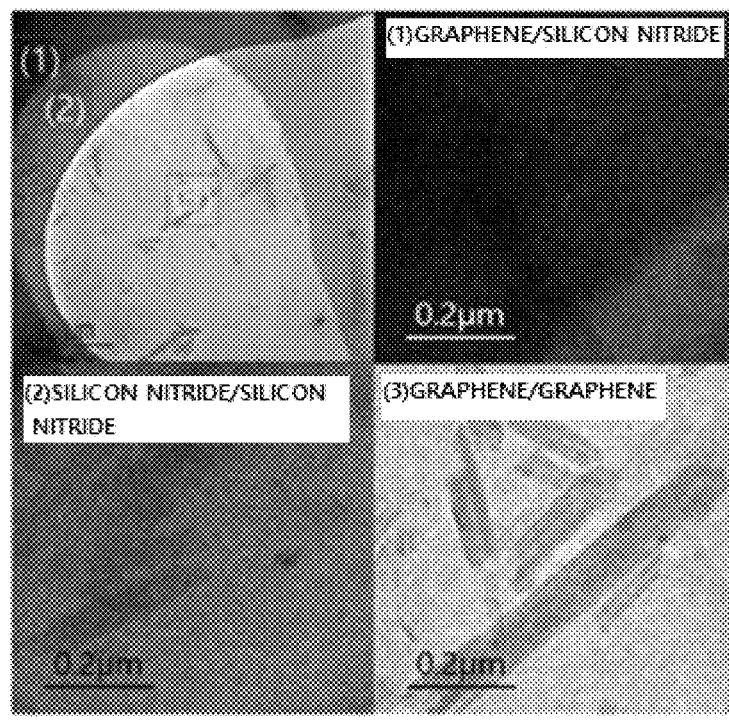

[FIG. 10]
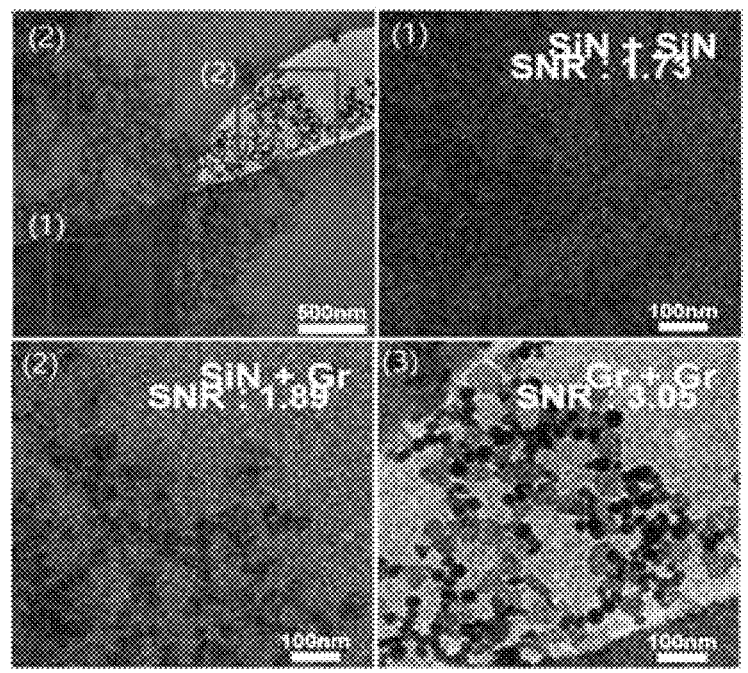

[FIG. 11]
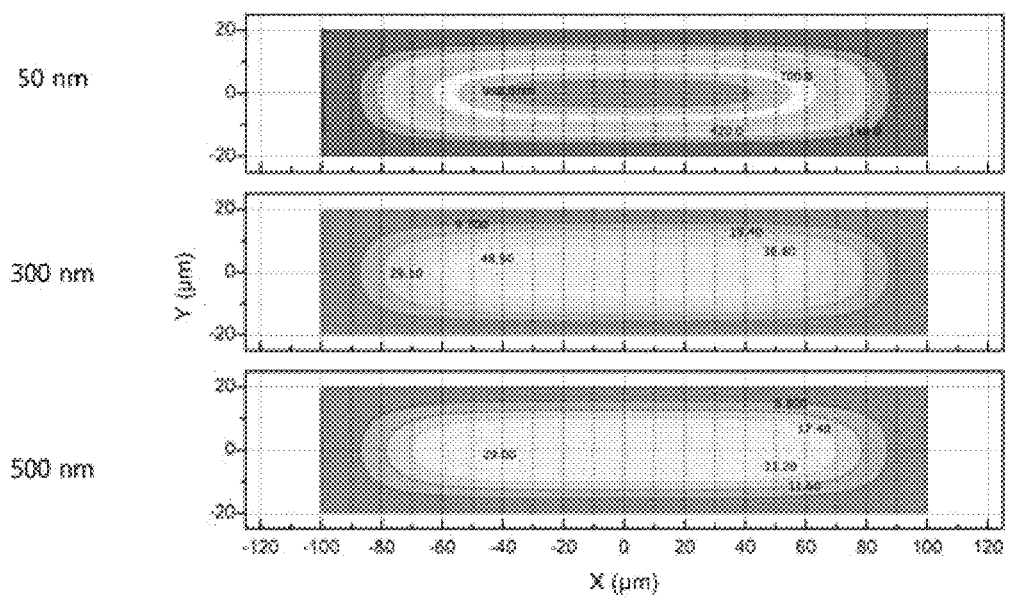

[FIG. 12]
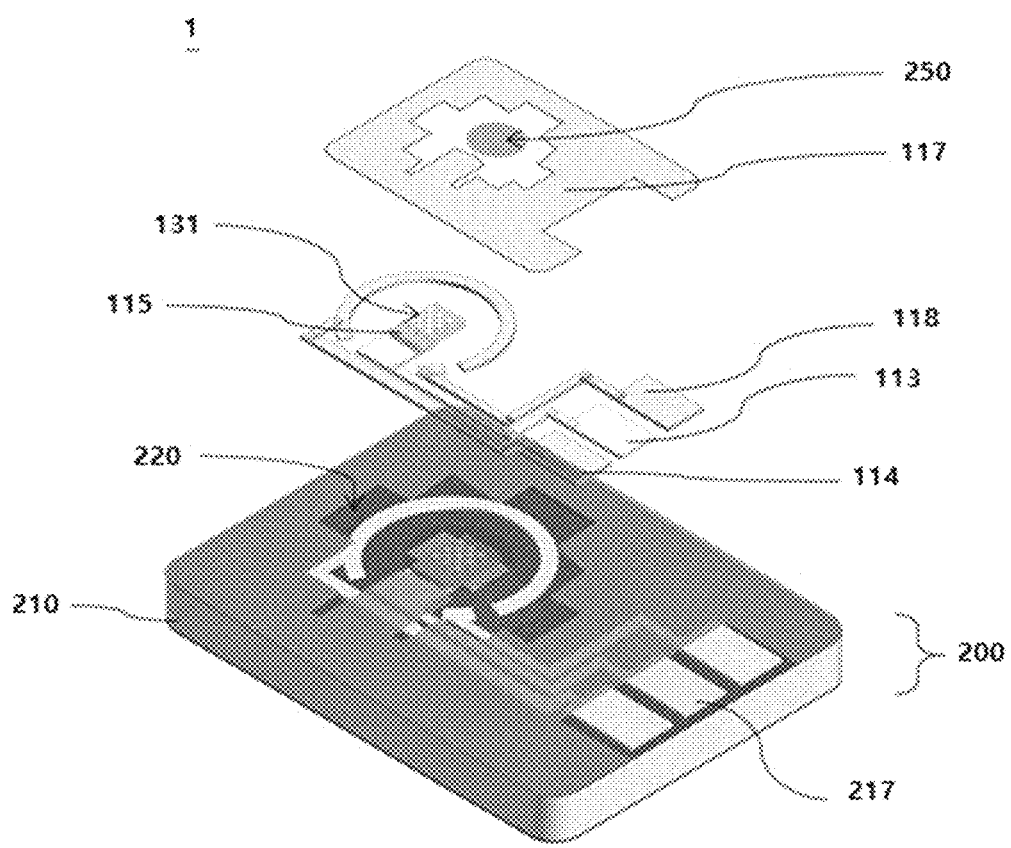

[FIG. 13]
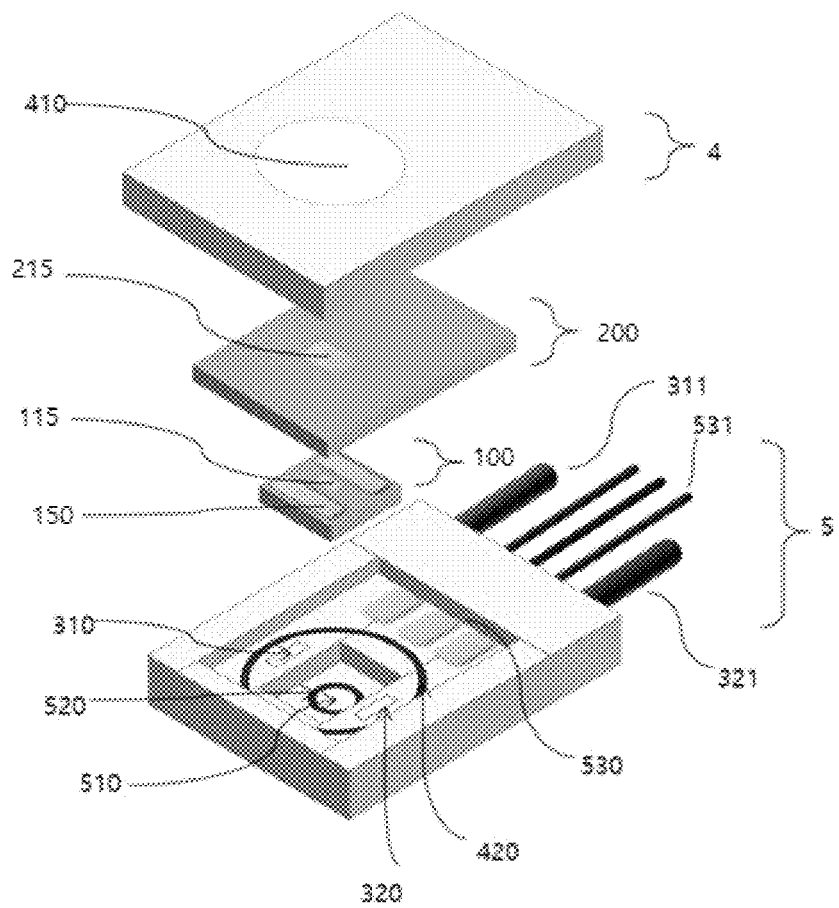

[FIG. 14A]
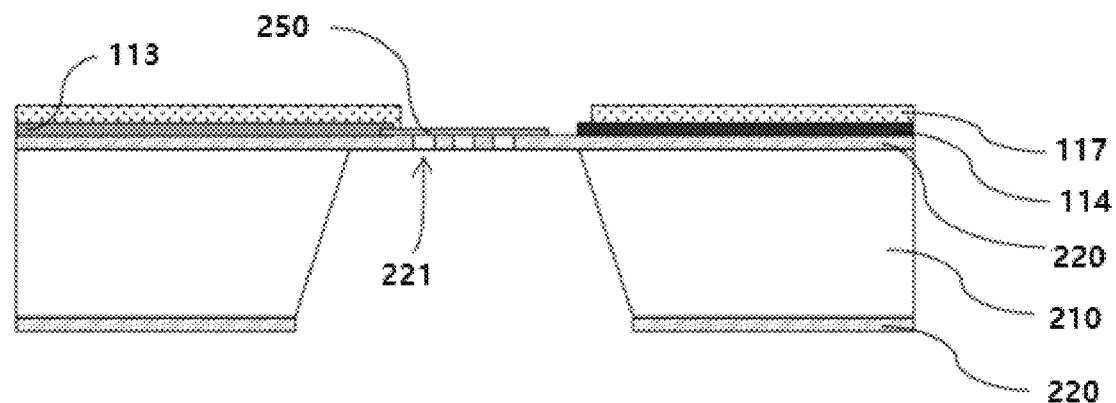
[FIG. 14B]
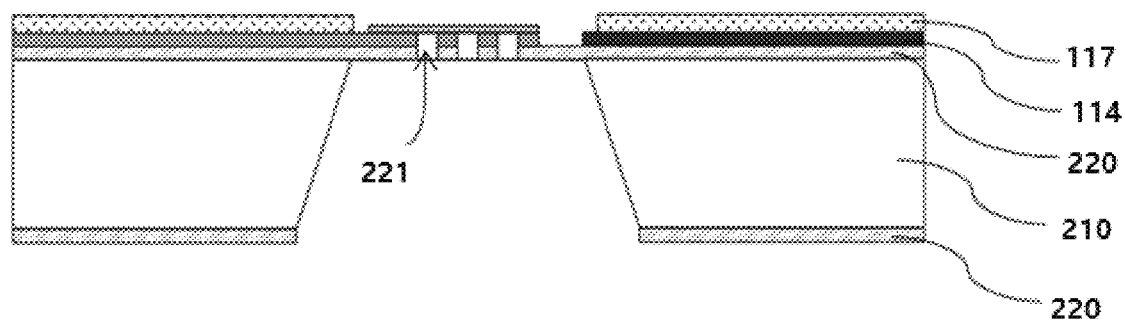
[FIG. 14C]
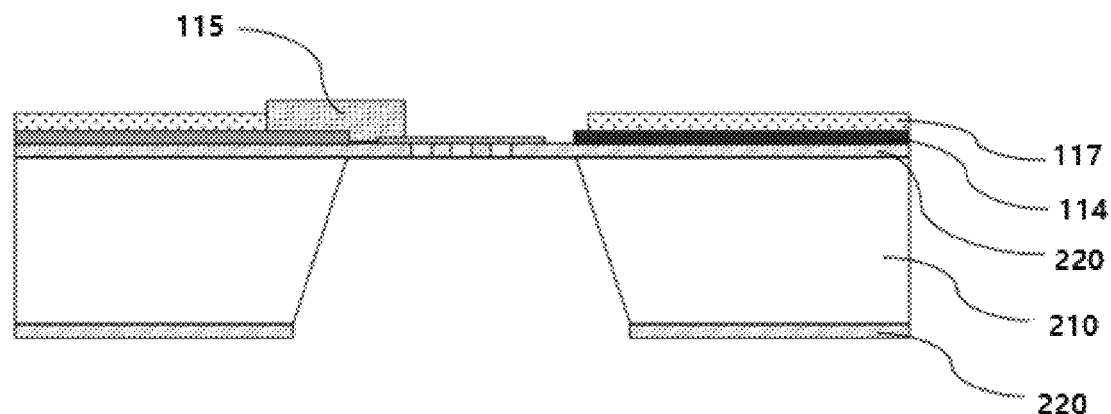

[FIG. 14D]
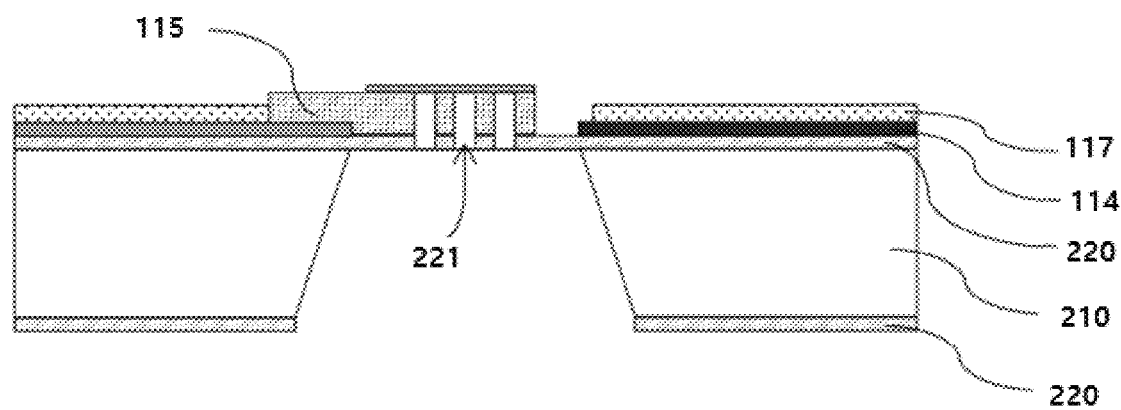
[FIG. 15]
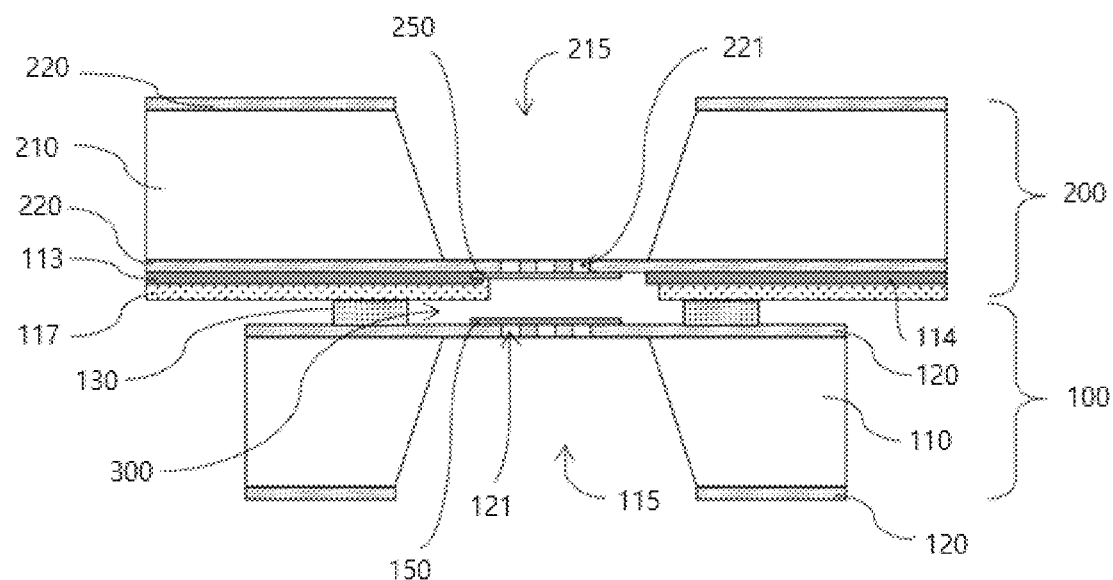

[FIG. 16]
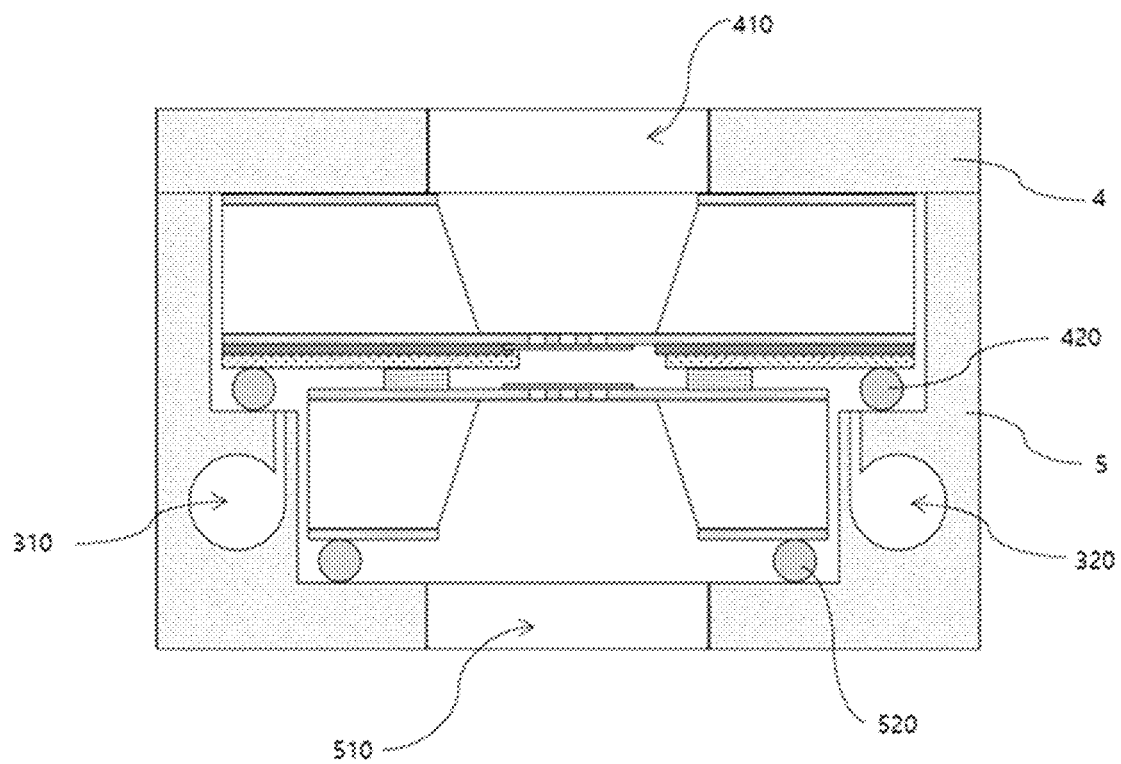

[FIG. 17]
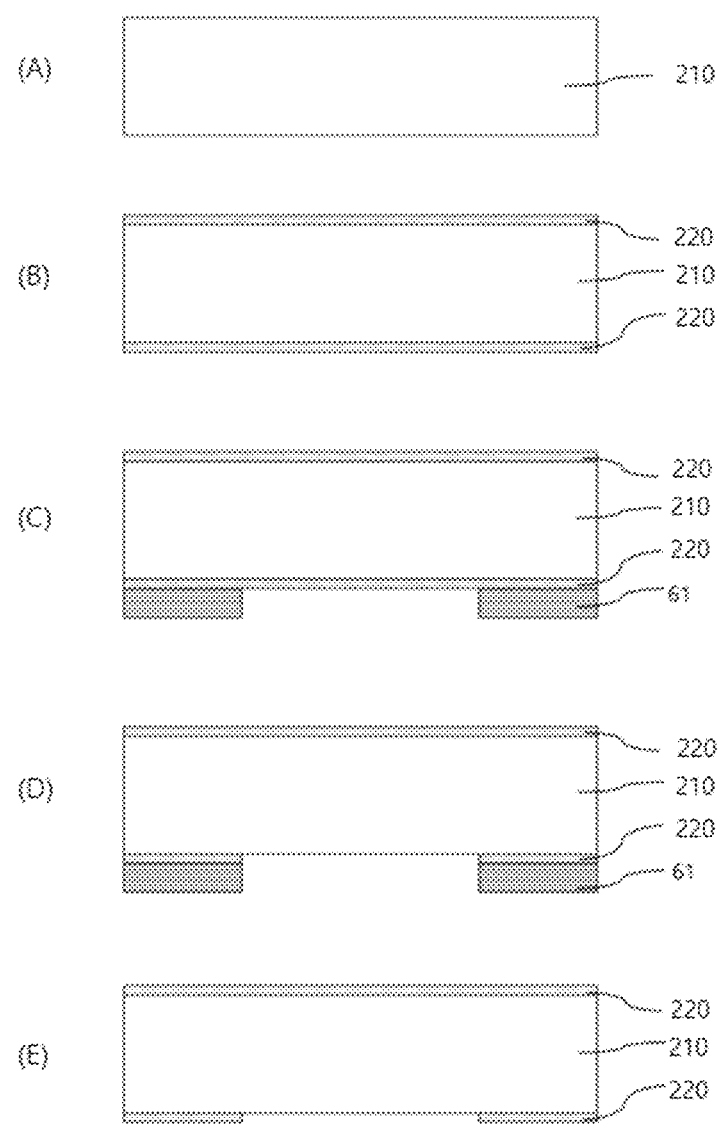

[FIG. 18]
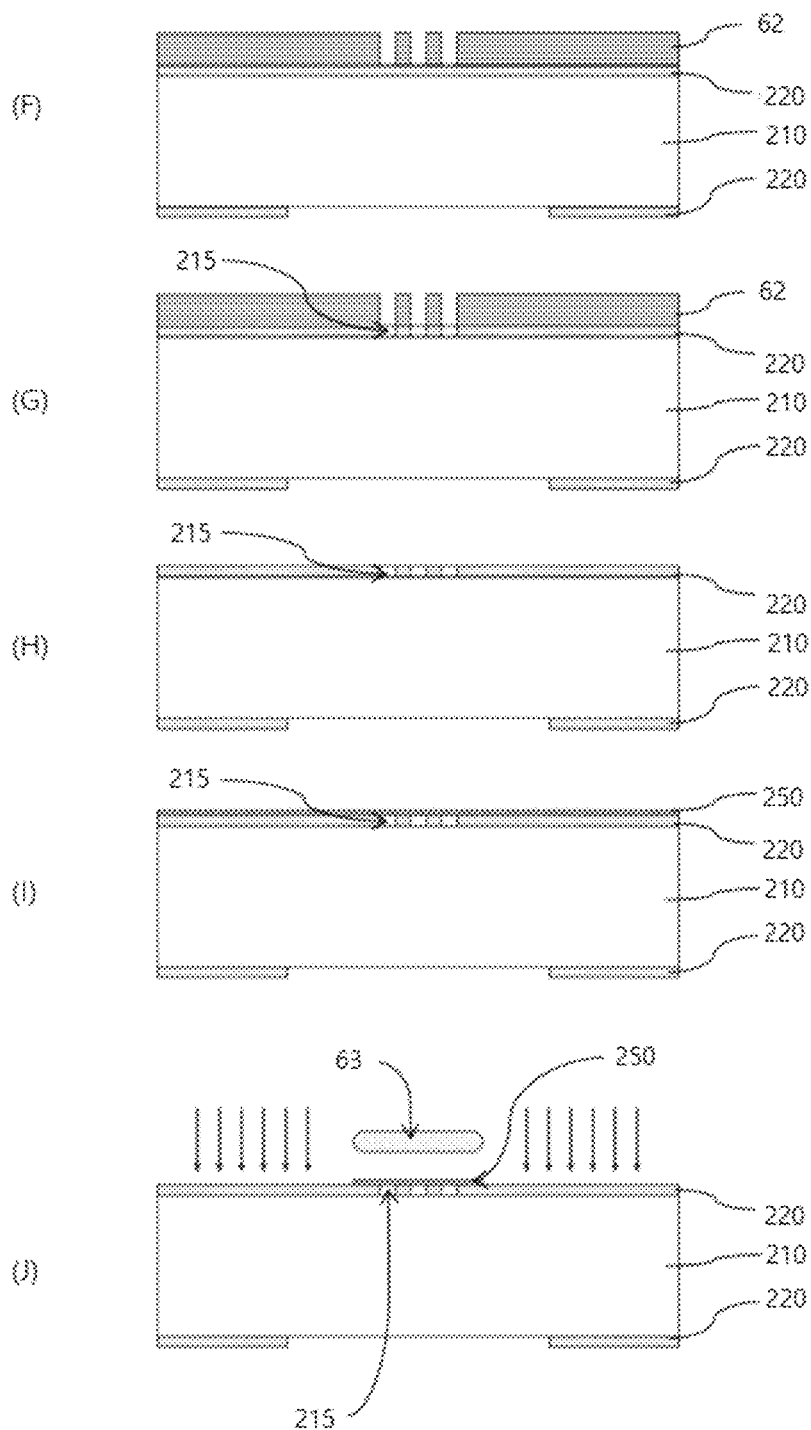

[FIG. 19]
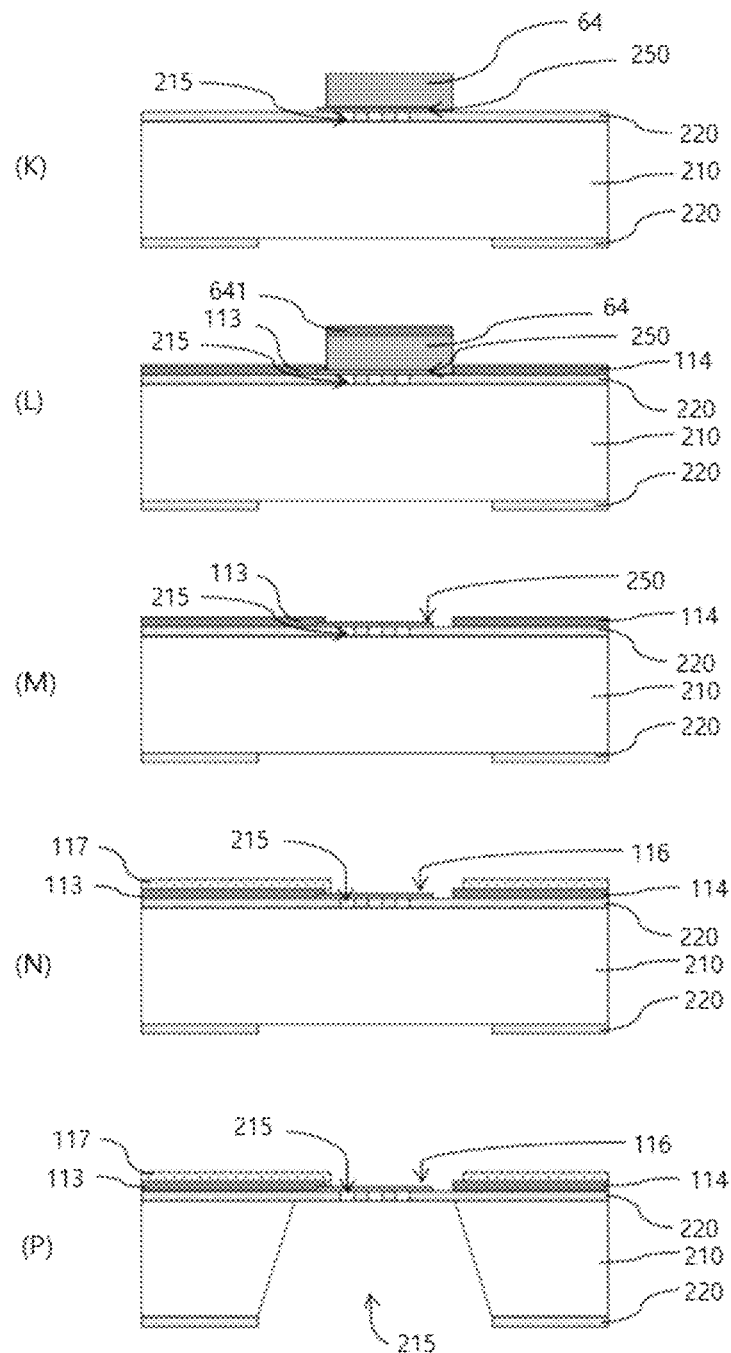

[FIG. 20]
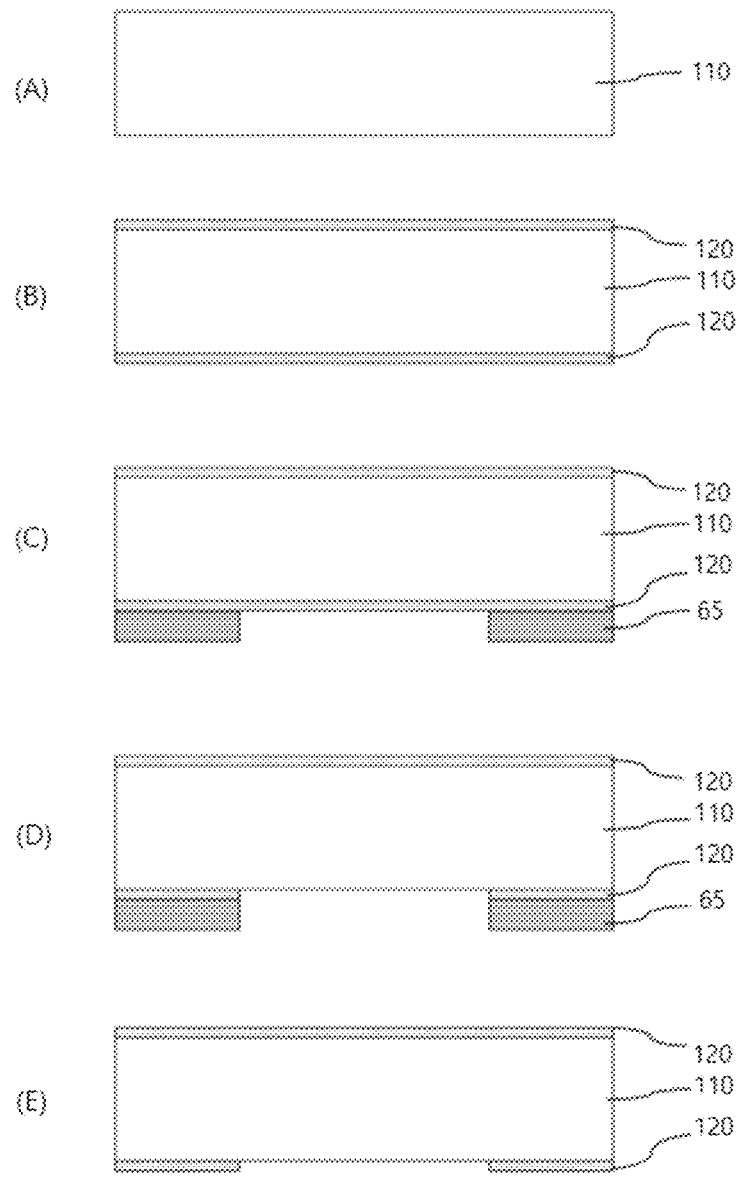

[FIG. 21]
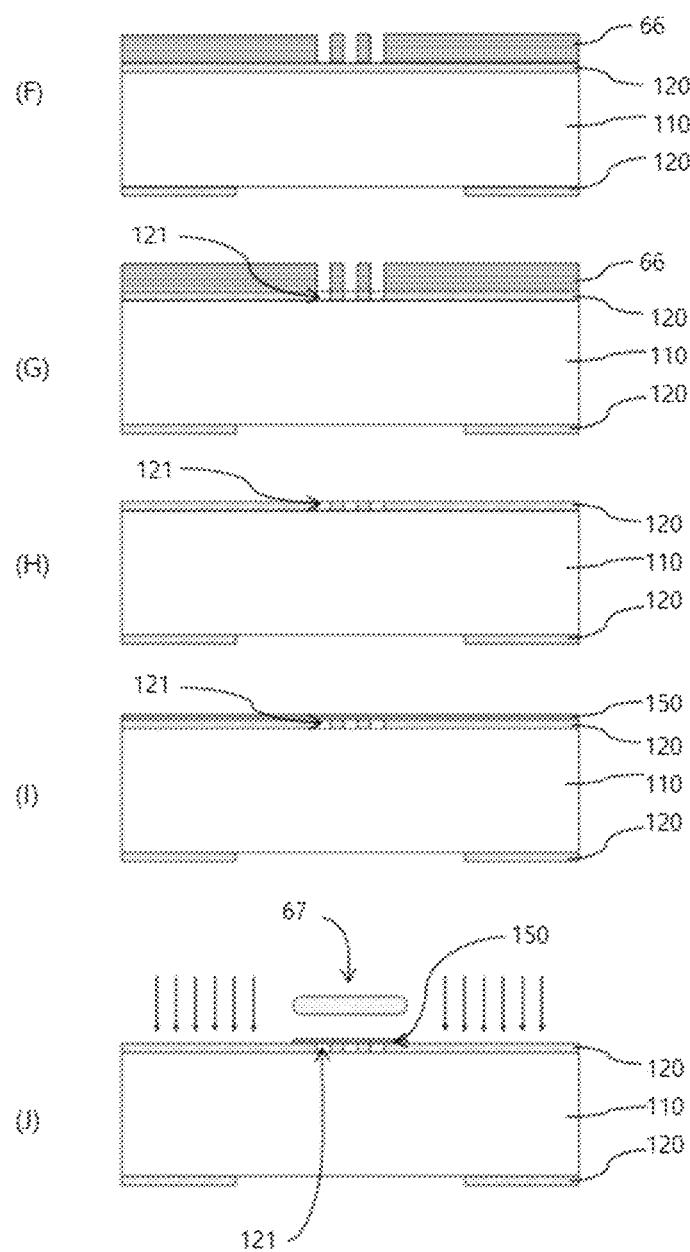

[FIG. 22]
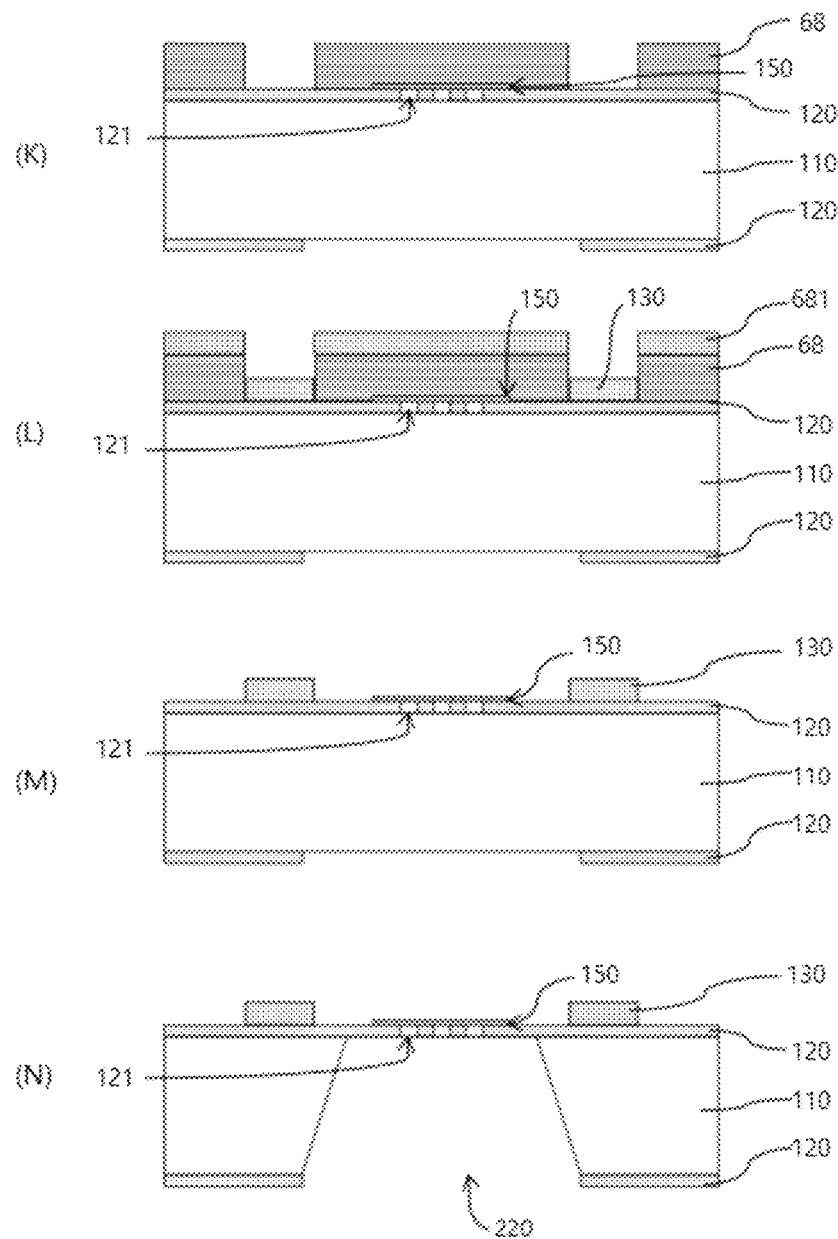

[FIG. 23]
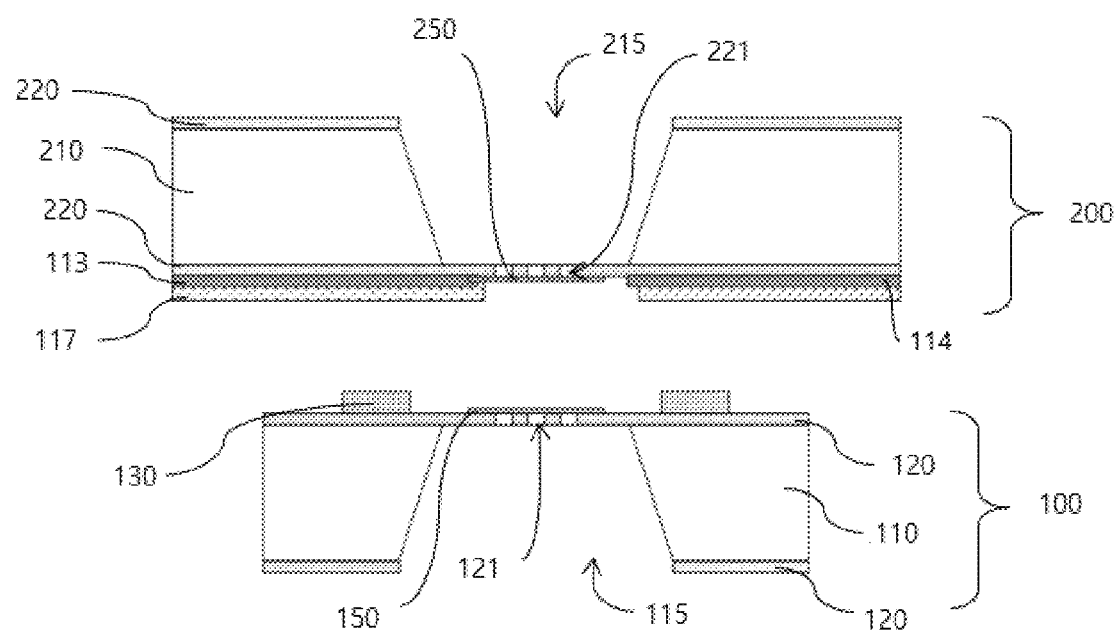

[FIG. 24]
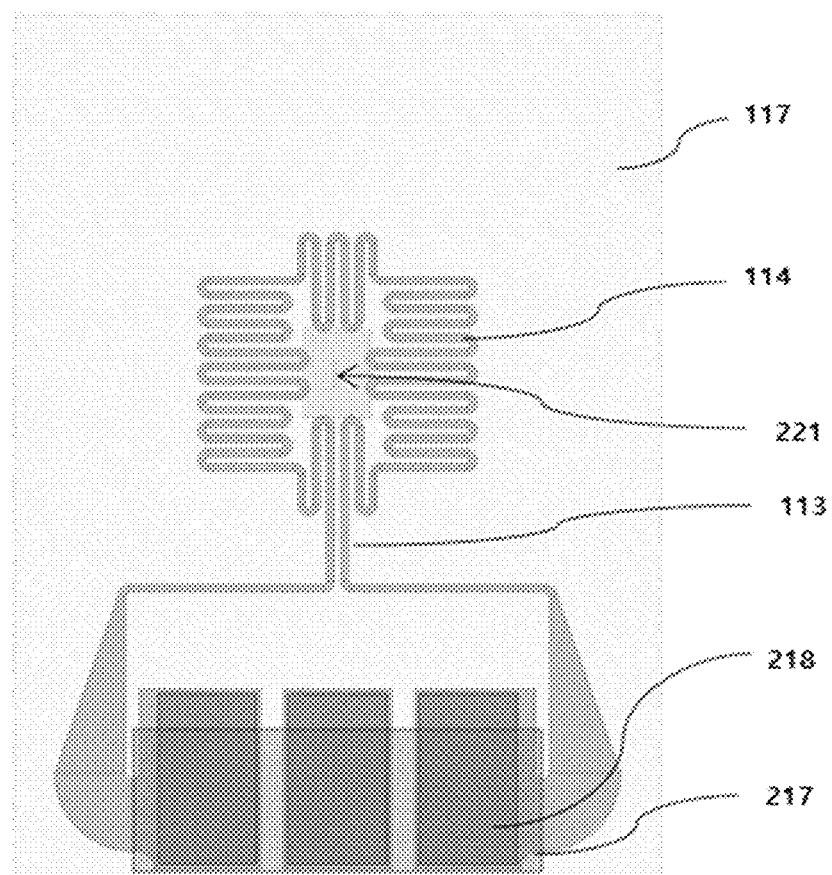

[FIG. 25]
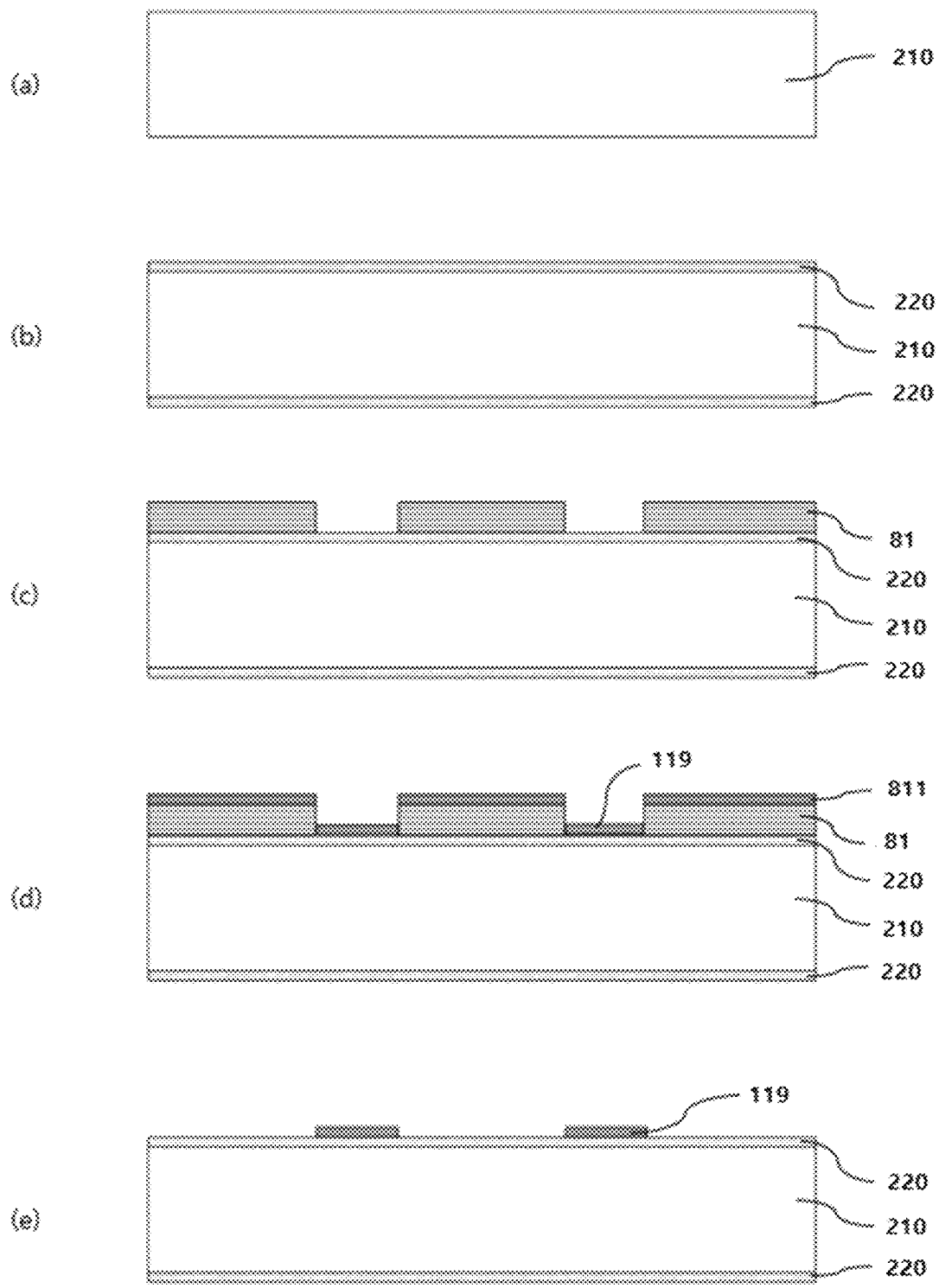

[FIG. 26]
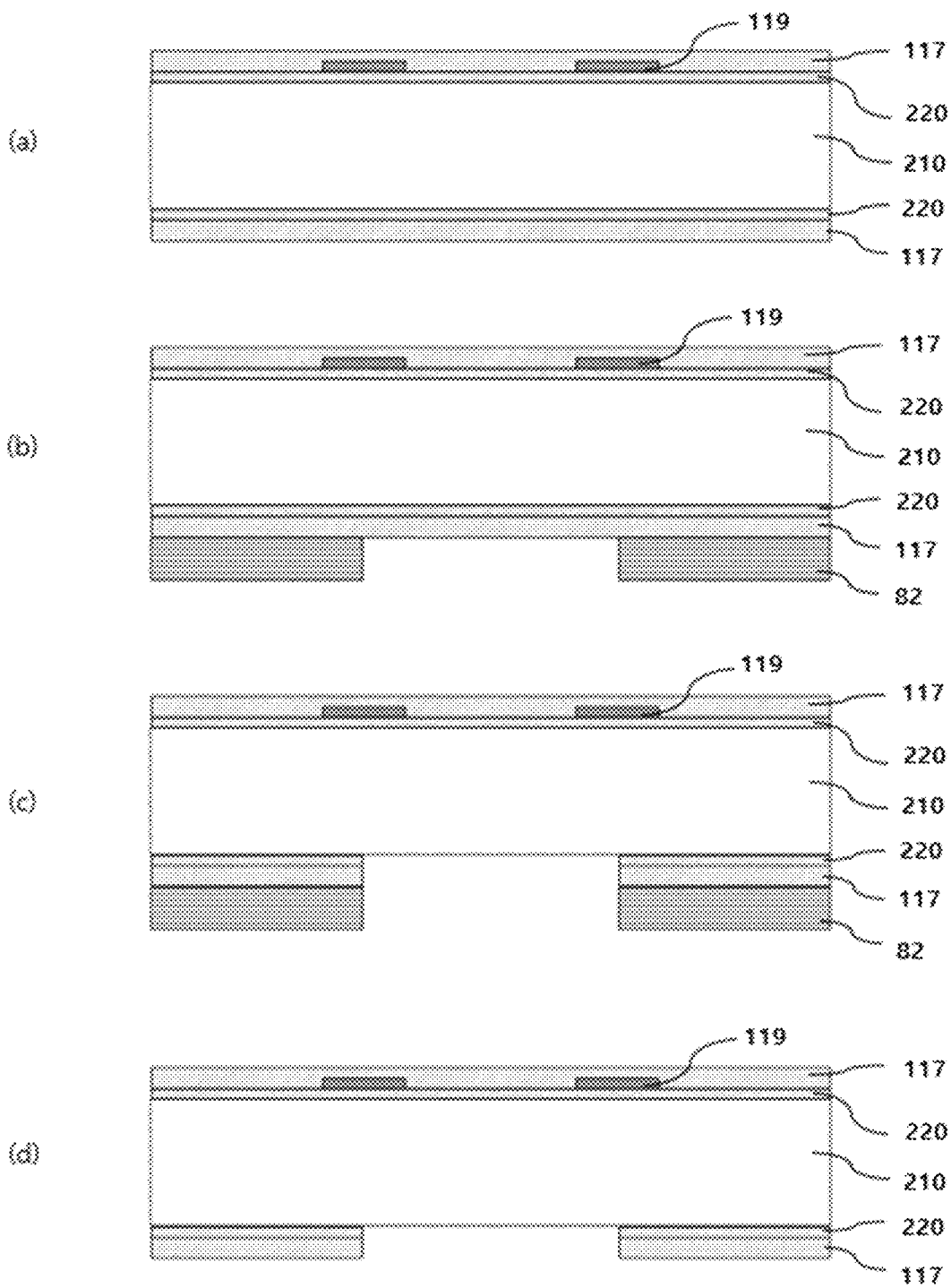

[FIG. 27]
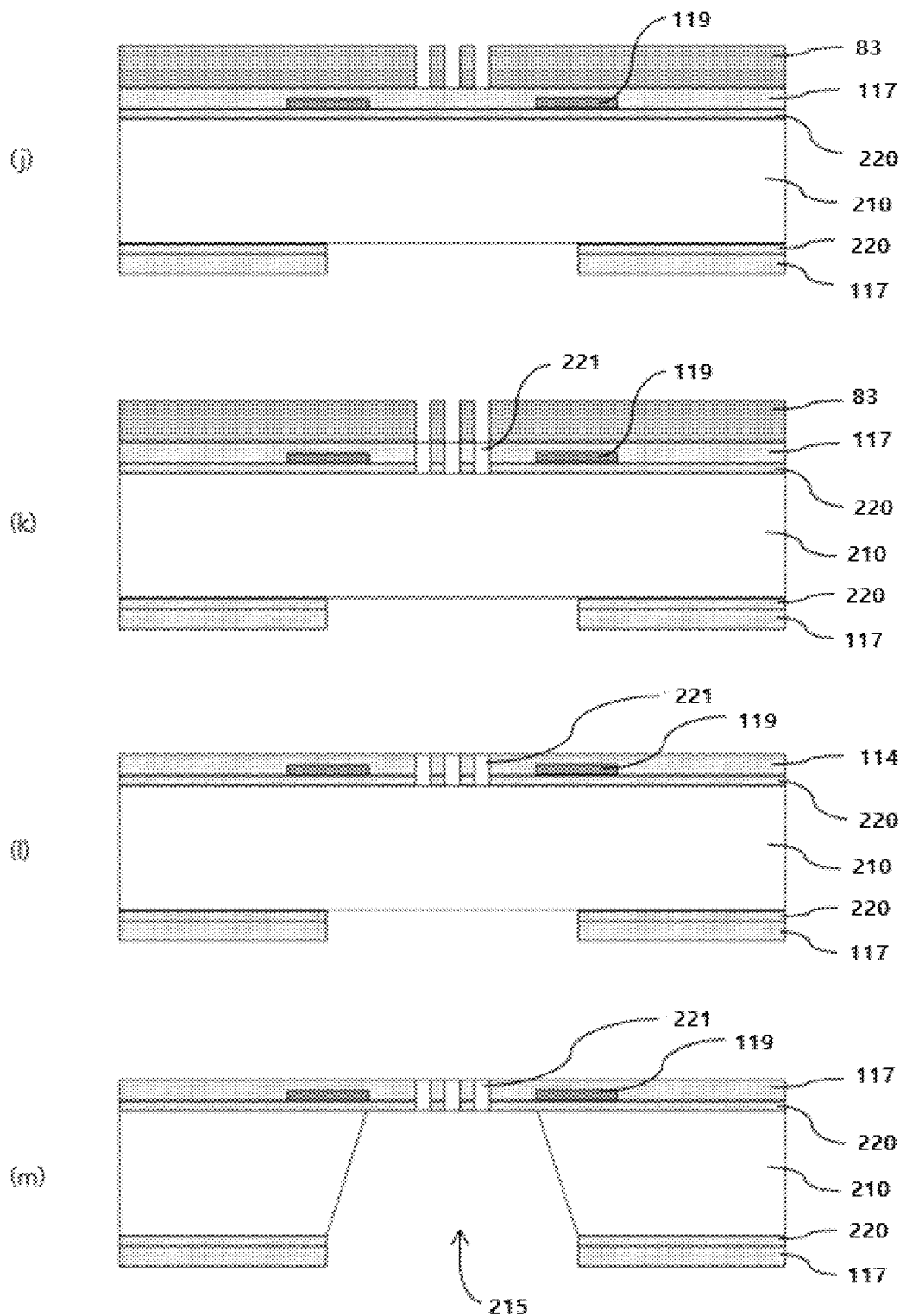

[FIG. 28]
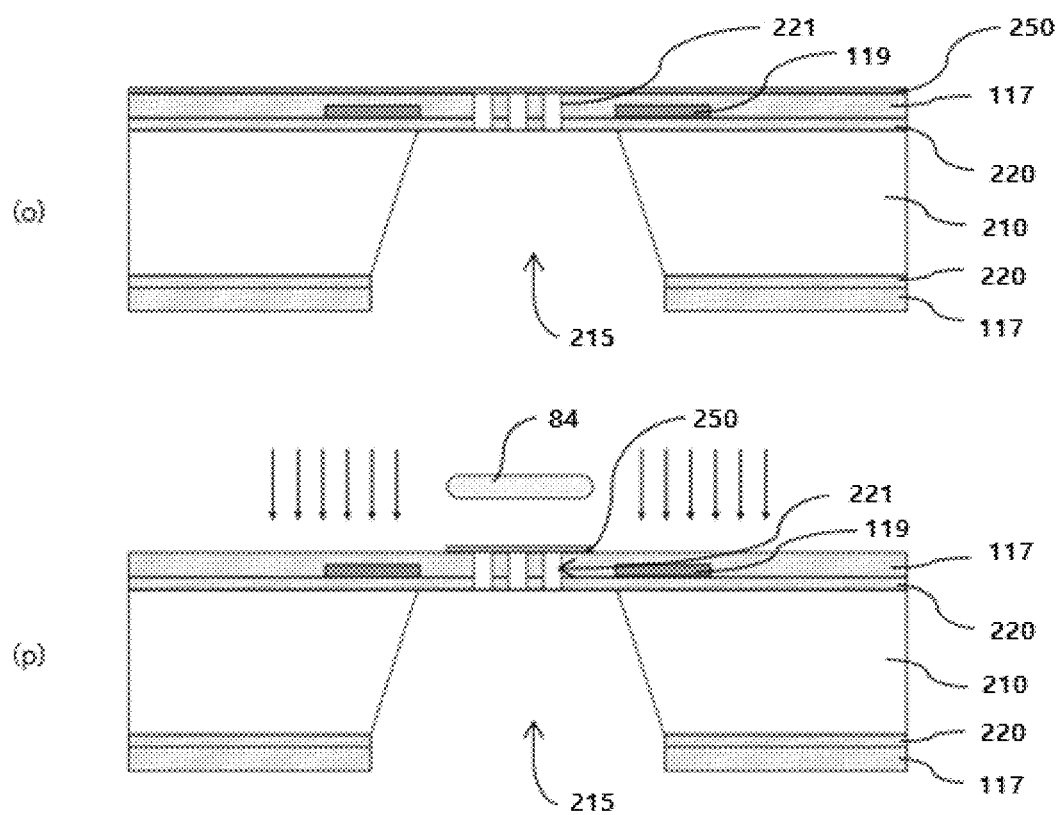

LIQUID CHIP FOR ELECTRON MICROSCOPE HAVING EXCELLENT BULGING RESISTANCE

CROSS-REFERENCE(S) TO RELATED APPLICATIONS

This application claims priority to Korean Patent Application No. 10-2019-0009589, filed on Jan. 25, 2019, the disclosure of which is incorporated herein by reference in its entirety.

BACKGROUND OF THE DISCLOSURE

Field of the Disclosure

The present disclosure relates to a fluid chip for a transmission electron microscope, and more particularly, to a fluid chip for a transmission electron microscope for observing the fluid containing sample in real time while supplying the fluid sample.

Further, the present disclosure relates to a fluid chip for an electron microscope including an electrode to enable electrochemical or thermochemical reaction analysis of a fluid containing sample.

Description of the Related Art

An electron microscope irradiates the electron beam to a sample to magnify the internal microstructure and enables observing chemical reaction in the sample at high magnification. When using the electron microscope, an operator may analyze chemical composition and reaction from several hundreds of microns to an atomic scale. At this time, a fluid chip may deployed to the electron microscope to dispose the fluid sample in the electron microscope. The fluid chip serves as a container for sample consisting of fluid to allow an operator to easily irradiate the electron beam to the sample.

The fluid chip is widely used in a transmission electron microscope (TEM) among the various types of electron microscopes. When the fluid chip is used in the TEM, key object was to put the fluid in an apparatus safely within ultra-high vacuum while the spatial resolution, which is the biggest advantage of the TEM, is sacrificed. A material constituting the fluid chip should be basically isolative to any material, but should be transparent to the electron beam, while high mechanical characteristics be required to resist from the structural deformation induced by the pressure generated in the vacuum compartment. The representative material for capsuling agent is amorphous silicon nitride ($SiN_x$) thin film, which may be easily manufactured by using a silicon-based microelectromechanical systems (MEMS) process and satisfying the structural prerequisites. However, there has been a problem in that in order to maintain the structure in vacuum, the thickness of encapsulant membrane should have several tens of nanometers or more, which causes a lot of inelastic scattering at the encapsulant itself, therefore the spatial resolution is diminished. Furthermore, there has been a problem in that the fluid chip located in the ultra-high vacuum has a large difference between the internal pressure and the external pressure, thereby causing the bulging effect in which the $SiN_x$ thin film constituting the fluid chip deflects toward the chamber, such that the thickness of the fluid inside a fluid cell becomes significantly larger than intention, thereby diminishing the spatial resolution of the TEM.

With increasing interest of green energy, research on the next-generation battery with high performance and stability to replace the currently commercialized lithium ion cell battery used in an electric vehicle, is widely conducted. In order to investigate detailed mechanisms of battery operations, correlative and atomic level observation during an operation in real time by using the TEM is required, but due to technological limitations, present analytical methodology has been stayed on post-mortem characterization, or indirect lithiation behavior observation induced by the electron beam. Since these conventional analytical techniques do not observe the reaction based on real battery operation condition, there has been a limit which may not confirm the accurate battery operation mechanism.

Meanwhile, many reactions in nature require a specific temperature or more to overcome the energy barrier. In particular, to understand the accurate mechanism of the reaction activated by heat, such as in vivo bioreactions, or various wet processes at the semiconductor fabrication process, high resolution observation with precise control of the fluid temperature may require. However, since commercialized fluid heating chips consists of thick effective encapsulant layer inherent from additional heating element, and passivation layer, it is inevitable to loss of spatial resolution due to the signal attenuation at the encapsulant. In addition, the insulation layer of commercialized chip has been manufactured by coating a soft photoresist which has very poor chemical resistance and thermomechanical stability and due to the fragility of this fluid heating unit, a heater cannot placed nearby of fluid channel but circumference of fluid chip. Hence, fluid is inefficiently and indirectly heated by the nearby silicon frame attached with heater. Thus, its applications have been very limited due to a difficulty in precise temperature control. Therefore, there is a need to develop a platform for high resolution fluid electron microscope capable of efficient and precise electrochemical and thermal reactions in flowing medium.

RELATED ART DOCUMENT

Patent Document (Patent Document 1) Japanese Patent Laid-open Publication No. 2016-110877 (published date: Jun. 20, 2016)

SUMMARY OF THE DISCLOSURE

An object of the present disclosure is to provide a fluid chip for a TEM, which may suppress the bulging phenomenon of a fluid chip while accommodating a fluid sample in a TEM more stably, thereby minimizing the loss of a spatial resolution.

Another object of the present disclosure is to provide a fluid chip for an electron microscope including an electrode to enable the electrochemical or thermochemical reaction analysis of a fluid sample.

For achieving the objects, the present disclosure is characterized that in a fluid chip for an electron microscope including a lower chip, an upper chip, and a fluid channel part for supplying a fluid sample, the lower chip includes a lower substrate having a lower cavity formed therein; a lower support disposed on the upper surface of the lower substrate, and including a lower support having a plurality of holes formed at a position corresponding to the lower cavity; a spacer positioned at both ends of the lower support; and a lower transmissive thin film part attached on the lower support to cover the lower support, the upper chip includes an upper substrate having an upper cavity formed therein; an upper support disposed on the upper surface of the upper substrate, and an upper support having a plurality of holes formed at a position corresponding to the upper cavity; and an upper transmissive thin film part attached on the upper support to cover the upper support, and the fluid channel part is formed by stacking the upper support disposed on the upper surface of the upper substrate on the spacer of the lower chip, and the transmissive thin film part is positioned inside the fluid channel part.

The plurality of upper holes and the plurality of lower holes are preferably aligned on a straight line at assembled state.

Further, the upper transmissive thin film part or the lower transmissive thin film part may contain a two-dimensional material, which is, as a representative example, may be at least any one from the group consisting of graphene, borophen, transition metal dichalcogenide (TMDC), and hexagonal-boron nitride (BN), and may also be attached by transferring the two-dimensional material in a dry or wet method.

Further, the upper substrate or the lower substrate may be a silicon material, the upper support or the lower support may be a $SiN_x$ or silicon oxide ($SiO_x$) material, and the spacer may be a metal, ceramic, or polymer material.

In the fluid chip for the electron microscope according to the present disclosure, one end of the spacer may be formed with a contact pad part for connecting with an external electrical supply and the other end placed in fluid channel part in order to apply a current to the fluid sample in the fluid channel part.

The fluid chip for the electron microscope according to the present disclosure may include a first electrode and a second electrode having electrical conductivity, placed on a specific hole part from the lower hole part or the upper hole part or in the vicinity of the specific hole part.

The other ends of the first electrode and the second electrode may be disposed outside of the fluid channel part to be electrically connected with an external power source.

A certain portion including one end of the first electrode may be disposed in a form of surrounding the vicinity of the selected hole part, and one end of the second electrode may be disposed in the selected hole part and formed with an electrode through hole corresponding to a plurality of holes formed in the selected hole part.

One end of the second electrode may be disposed between the selected hole part and a transmissive thin film part covering the selected hole part.

The respective other ends of the first electrode and the second electrode may be formed with a contact pad part having a constant area to facilitate the electrical connection with the external electrical supply source, and a certain portion or more of the first electrode or the second electrode may be insulated by an insulation layer.

In the fluid chip for the electron microscope according to the present disclosure, one end of a third electrode having constant electrical conductivity may be disposed in the vicinity of the selected hole part, and the other end of the third electrode may be disposed outside the fluid channel part for the electrical connection with the external electrical supply source.

Further, in the fluid chip for the electron microscope according to the present disclosure, the respective one ends of the first electrode and the second electrode may be short-circuited with each other to be connected, and the first electrode and the second electrode may be a material having resistive heating property.

At this time, the first electrode and the second electrode may be positioned inside a support including the selected hole part except for the respective ends, and the first electrode and the second electrode may be insulated by an insulation layer.

According to the present disclosure, since the support does not serve as the transmissive window, the support may be formed thicker than the conventional one to increase the bulging resistance, thereby minimizing the loss of the spatial resolution while supplying the fluid sample more stable.

Further, since the transmissive thin film part is positioned inside the fluid channel part, the transmissive thin film part receives a strong outward tensile force due to the internal pressure of the channel under the ultra-high vacuum state. To disperse the pressure applied at the support, thereby physically preventing the peeling phenomenon of the transmissive thin film part as compared with positioning it outside the fluid channel part.

Further, it is possible to flatly form the inside of the fluid channel part according to the present disclosure without the structurally separate protrusion, thereby preventing the solid materials inside the fluid sample from being fixed to the protrusion or the like or preventing vortex from being formed, and evenly maintaining the thickness of the supplied fluid sample.

Further, the present disclosure may couple the upper and lower chips, which are prepared separately, on the holder, thereby reforming the surface in the method of converting the upper surface of the chip forming the channel into the hydrophilic property or having a charge thereon by the plasma or chemical modifications.

Further, the present disclosure may dispose the first and second electrodes having the constant electrical conductivity in the selected hole part from the upper hole part or the lower hole part and in the vicinity thereof, thereby confirming the electrochemical reaction of the fluid sample flowing through the fluid channel part.

Further, according to the present disclosure, if the respective one ends of the first electrode and the second electrode are short-circuited with each other to be connected, and the first electrode and the second electrode connected to each other are a material having the resistive heating property, it is also possible to confirm the thermochemical reaction of the fluid sample as the heating device.

Further, the present disclosure has the excellent productivity improvement because mass production may be possible by a unit of the wafer by the MEMS process.

BRIEF DESCRIPTION OF THE DRAWINGS

FIG. 1 is a schematic diagram of a TEM capable of applying a fluid chip according to a first embodiment of the present disclosure.

FIG. 2 is a cross-sectional diagram of the fluid chip according to the first embodiment of the present disclosure.

FIG. 3 is an exploded perspective diagram of the fluid chip according to the first embodiment of the present disclosure.

FIG. 4 is a perspective diagram showing the appearance in which electron beam transmits a transmissive window of the fluid chip according to the first embodiment of the present disclosure.

FIG. 5 is a schematic diagram showing whether the thickness of the fluid sample is changed according to a position of a transmissive thin film part.

FIG. 6 is drawings showing a process of manufacturing a lower chip according to the first embodiment of the present disclosure.

FIG. 7 is drawings showing a process of manufacturing an upper chip according to the first embodiment of the present disclosure.

FIG. 8 is an image and a graph showing the transparency of the electron beam for each transmissive point using the fluid chip according to the present disclosure.

FIG. 9 is a diagram showing an electron microscope image for each transmissive point of the fluid chip according to the present disclosure with respect to the fluid sample in which kaolinite bars have been dispersed.

FIG. 10 is a diagram showing an electron microscope image for each transmissive point according to the fluid chip according to the present disclosure with respect to a gold nanoparticle.

FIG. 11 is a diagram showing an image representing an elastic deformation degree according to a position of $SiN_x$ by thickness.

FIG. 12 is an exploded perspective diagram of an upper chip of a fluid chip according to a second embodiment of the present disclosure.

FIG. 13 is an exploded perspective diagram of the fluid chip according to the second embodiment of the present disclosure and a holder for accommodating it.

FIG. 14A to 14D are cross-sectional diagrams of the upper chips of various forms of the fluid chip according to the second embodiment of the present disclosure.

FIG. 15 is a cross-sectional diagram of the fluid chip in which the upper chip and the lower chip in FIG. 14A have been stacked.

FIG. 16 is a cross-sectional diagram showing a state where the fluid chip in FIG. 15 has been inserted into the holder.

FIGS. 17 to 19 are flowcharts showing a process of manufacturing the upper chip in FIG. 14A.

FIGS. 20 to 22 are flowcharts showing a process of manufacturing the lower chip of the fluid chip according to the second embodiment of the present disclosure.

FIG. 23 is a cross-section diagram showing before the upper chip and the lower chip of the fluid chip according to the second embodiment of the present disclosure are coupled.

FIG. 24 is a plane diagram of an upper chip of a fluid chip according to a third embodiment of the present disclosure.

FIGS. 25 to 28 are plane diagrams of the upper portion of the fluid chip according to the third embodiment of the present disclosure.

DESCRIPTION OF SPECIFIC EMBODIMENTS

Advantages and features of the present disclosure, and methods for achieving them will be apparent with reference to the embodiments described below in detail together with the accompanying drawings. However, the present disclosure is not limited to the embodiments disclosed below but may be implemented in various different forms, and only the present embodiments are intended to complete the disclosure of the present disclosure and to provide to fully convey the scope of the disclosure to those skilled in the art to which the present disclosure pertains, and the present disclosure is defined only by the scope of the claims. The same reference numerals refer to the same components throughout the specification.

Further, the embodiments described herein will be described with reference to cross-sectional diagrams and/or plane diagrams, which are ideal exemplary diagrams of the present disclosure. In the drawings, the thicknesses of films and regions are exaggerated for effective explanation of technical content. Therefore, forms of the exemplary diagrams may be deformed by manufacturing techniques and/or tolerances, or the like. Therefore, the embodiments of the present disclosure are not limited to the shown specific forms but also include a change in the form generated according to the manufacturing process. For example, the etched region shown at a right angle may be rounded or a form having a predetermined curvature. Therefore, the regions shown in the drawings have schematic attributes, and the shapes of the regions shown in the drawings are intended to exemplify a particular form of the region of the device and not for limiting the scope of the disclosure.

FIG. 1 is a schematic diagram of a TEM to which a fluid chip according to the present disclosure is applied. Referring to FIG. 1, a TEM 10 may magnify and observe a sample by using a polarized electron beam and lenses. For example, the TEM 10 may be used not only to observe the lithium ion battery reaction provided in a fluid chip 1 or the like, but also used in the precipitation of minerals, hydrated bio samples, colloidal particles, batteries, semiconductor processes, and the like. For this purpose, external stimulating systems are generally forms in the fluid chip 1 to be electrically connected with an apparatus capable of applying photonic, electric or mechanical stimulus by optical fibers, electrodes, and piezoelectrics.

The TEM 10 may include an electron gun 11, a condenser lens 13, an objective lens 15, a projection lens 17, and a screen 19. The electron gun 11 is composed of a filament for emitting electrons, an anode for accelerating the emitted electrons at high speed, and a cathode for focusing the electron beam. The electron gun 11 may output an electron beam toward the sample provided in the fluid chip 1.

The condenser lens 13 is an electromagnet made of a cylindrical coil, and may serve to focus a negatively charged electron beam which has been output by the electron gun 11. The objective lens 15 is an electromagnet made of a cylindrical coil, and may serve to adjust the focus of the electron beam having passed through the sample. The projection lens 17 is an electromagnet made of a cylindrical coil, and may serve to project the electron beam having passed through the objective lens 15 onto the screen 19. The TEM 10 may further include an additional corrective optics.

A holder 18 has a structure in which the fluid chip 1 may be inserted, and may be inserted into the TEM 10. The holder 18 may embed the fluid chip 1 through various fixing structures such as an O-ring, specialized gasket and a cover lid.

FIG. 2 is a cross-sectional diagram of the fluid chip according to a first embodiment of the present disclosure, FIG. 3 is an exploded perspective diagram of the fluid chip according to the first embodiment of the present disclosure, and FIG. 4 is a perspective diagram showing the appearance in which an electron beam is irradiated to the fluid chip according to the first embodiment of the present disclosure.

Referring to FIGS. 2 to 4, the fluid chip 1 has a structure including a lower chip 100 and an upper chip 200, and is formed with a fluid channel part 300 to which the fluid sample is supplied while the upper chip 200 and the lower chip 100 are stacked. The fluid sample may be continuously circulated and supplied through the fluid channel part 300.

First, the lower chip 100 will be described. The lower chip 100 is configured to include a lower substrate 110, a lower support 120, and a spacer 130.

The lower substrate 110 has an upper surface 110 a and a lower surface 110 b, and is formed with a lower cavity 115 penetrating the upper surface 110 a and the lower surface 110 b. A material of the lower substrate 110 may be silicon (Si).

The lower support 120 may be disposed on the upper surface 110 a of the lower substrate 110. In general, the lower support 120 may be disposed on the upper surface 110 a of the lower substrate 110 through a deposition process, and in this process, the lower support 120 may be disposed by being deposited on the entire surface as well as on the upper surface 110 a of the lower substrate 110. In order to maintain the mechanical characteristics of the lower chip 100, it is preferable to maintain the thickness of the lower substrate 110 thicker than several hundreds of microns. Further, the thickness of lower support 120 may increase up to few micrometers to prevent the bulging effect under ultra-high vacuum in transmission electron microscope.

A material of the lower support 120 may be $SiN_x$, $SiO_x$, or the like.

The lower support 120 is formed with the lower hole part 121 having a plurality of holes in a region where the lower cavity 115 has been formed. The electron beam having transmitted the lower cavity 115 may reach the fluid sample inside the fluid chip 1 through the lower hole part 121 to observe the fluid containing sample. The hole of the lower hole part 121 may be circular as in FIG. 4 but is not necessarily limited thereto, and may be formed in various shapes such as a square, a rectangle, or a triangle. The hole diameter of the lower hole part 121 may be variously several tens of microns to several tens of nanometers. The hole diameter of the lower hole part 121 and the thickness of the lower support 120 may be appropriately adjusted to prevent the bowing of a lower transmissive thin film part 150 covering the lower hole part 121. For example, the thickness of the lower support 120 may be several tens of nanometers to several microns.

At least one pair of spacers 130 are positioned at both ends of the lower support 120. When the lower chip 100 and the upper chip 200 are stacked, the fluid channel part 300 for supplying the fluid sample is formed by the spacer 130. Therefore, the height of the fluid channel is determined according to the height of the spacer 130. The spacer 130 may be made of a metal, ceramic, or polymer material.

The lower transmissive thin film part 150 having a physical tensile strength of a certain degree or more is attached on the lower support 120 to cover the plurality of lower hole parts 121. Since a very high pressure should be maintained inside the fluid chip 1 to which the fluid sample is supplied, the lower transmissive thin film part 150 requires a significant physical tensile strength. The lower transmissive thin film part 150 may be preferably a material capable of large area growth and synthesis, and large area transfer while maintaining a single molecular layer of a two-dimensional material structure. For example, the lower transmissive thin film part 150 may include at least any one material from the group consisting of graphene, borophen, TMDC, and hexagonal-BN. The most preferred among these is graphene with very superior physical properties. Further, if necessary, the lower transmissive thin film part 150 may also be present in a form in which a plurality of single layers are stacked. The lower transmissive thin film part 150 covers the plurality of lower hole parts 121 to enable the circulation of the fluid sample provided to the fluid chip 1, and may increase the resolution for observing the fluid sample due to atomic thickness. It may be efficiently in process that the lower transmissive thin film part 150 is attached by transferring graphene or the like in a dry or wet method.

A lower cover layer 160 may be disposed on the lower surface 110 b of the lower substrate 110. The lower cover layer 160 may also be made of the same material as that of the lower support 120, and may be formed in a process of depositing the lower support 120 on the lower substrate 110. The lower cover layer 160 serves to protect the lower substrate 110 during etching process.

Next, the upper chip 200 will be described.

The upper chip 200 may be disposed on the lower chip 100. The upper chip 200 may be disposed to contact the spacer 130 of the lower chip 100, and the upper chip 200 is stacked on the spacer 130 of the lower chip 100 in an inverted form to form the fluid channel part 300 in which the fluid sample is supplied and circulated.

The upper chip 200 is configured to include an upper substrate 210, an upper support 220, and an upper transmissive thin film part 250.

The upper substrate 210 has an upper surface 210 a and a lower surface 210 b, and is formed with a lower cavity 215 penetrating the upper surface 210 a and the lower surface 210 b. The upper substrate 210 may also be a silicon material.

The upper support 220 may be disposed on the upper surface 210 a of the upper substrate 210. In general, the upper support 220 may be disposed on the upper surface 210 a of the upper substrate 210 through deposition or the like, and the upper support 220 may also be disposed by being deposited on the entire surface as well as on the upper surface 210 a of the upper substrate 210. In order to maintain the mechanical characteristics of the upper chip 200 under the ultra-high vacuum, it is preferable to maintain the thickness of the upper substrate 210 thicker than several hundreds of nanometers. Likewise, the fact that the upper chip 200 may also maintain the excellent spatial resolution is because the upper support 220 is not involved in electron beam transmission not to cause the inelastic scattering of the electron beam, thereby ensuring the excellent spatial resolution. A material of the upper support 220 may include a SiNx or $SiO_x$ material.

The upper support 220 is formed with an upper hole part 221 having a plurality of holes formed in a region where the upper cavity 215 has been formed. The electron beam having transmitted the upper cavity 215 may reach the fluid sample inside the fluid chip 1 through the plurality of upper hole parts 221 to observe the fluid containing sample. The hole of the upper hole part 221 may be circular as in FIG. 4 but is not necessarily limited thereto, and may be formed in various shapes such as a square, a rectangle, or a triangle. The hole diameter of the upper hole part 221 may be variously several tens of microns to several tens of nanometers. The hole diameter of the upper hole part 221 and the thickness of the upper support 220 may be appropriately adjusted to prevent the bowing of the upper transmissive thin film part 250 covering the upper hole part 221. For example, the thickness of the upper support 220 may be several tens of nanometers to several microns.

The upper transmissive thin film part 250 having a physical tensile strength of a certain degree or more is attached to cover the upper hole part 221 formed on the upper support 220. Since a very high pressure should be maintained inside the fluid chip 1 to which the fluid sample is supplied, the upper transmissive thin film part 250 requires a significant physical tensile strength. The upper transmissive thin film part 250 may be preferably a material capable of large area growth and synthesis, and large area transfer while maintaining a single molecular layer of a two-dimensional material structure. For example, the upper transmissive thin film part 250 may include at least any one material from the group consisting of graphene, borophen, TMDC, and hexagonal-BN. More preferred one of these may be graphene having a superior physical properties. The upper transmissive thin film part 250 may also be present in a form of a plurality of single layers. The upper transmissive thin film part 250 covers the upper hole part 221 to enable the circulation of the fluid sample provided to the fluid chip 1, and may increase the resolution for observing the fluid sample due to atomic thickness. It may be efficient in process that the upper transmissive thin film part 250 is attached by transferring graphene or the like in a dry or wet method.

An upper cover layer 260 may be disposed on the lower surface 210 *b* of the upper substrate 210. The upper cover layer 260 may also be made of the same material as that of the upper support 220, and may be formed in a process of depositing the upper support 220 on the upper substrate 210. The upper cover layer 260 serves to protect the upper substrate 210 during etching process.

Next, the fluid channel part 300 is formed by stacking and sealing the upper support 220 disposed on the upper surface 201 *a* of the upper substrate 210 on the spacer 130 of the lower chip 100. As in FIG. 2, the upper chip 200 is stacked on the lower chip 100 in an inverted state, and at this time, the upper hole part 221 and the lower hole part 121 may be preferably disposed in a straight line in terms of the electron beam transmission.

Since the fluid channel part 300 is formed by stacking the upper chip 200 on the lower chip 100, the upper and lower transmissive thin film parts 150, 250 are positioned inside the fluid channel part 300. As in FIG. 5A, if the transmissive thin film parts 150, 250 are positioned inside the fluid channel part 300, the thickness of the fluid sample through which the electron beam transmits may be constant even if the thicknesses of the upper and lower supports 120, 220 are increased, and it is possible to increase the thickness of the upper and lower supports 120, 220, thereby securing the bulging resistance. On the other hand, there occurs a problem in that if the upper and lower transmissive thin film parts 150, 250 are positioned outside the fluid channel part 300 as in FIG. 5B, the thickness of the fluid sample through which the electron beam transmits is changed according to the thicknesses of the supports 120, 220.

Further, if the transmissive thin film parts 150, 250 are positioned inside the fluid channel part 300 as in FIG. 5A, a portion contacting the fluid channel part 300 is only surrounded by the transmissive thin film parts 150, 250, such that the surface treatment method of the transmissive thin film parts 150, 250 is valid to apply consistent surface reformation. On the other hand, if the upper and lower transmissive thin film parts 150, 250 are positioned outside the fluid channel part 300 as in FIG. 5B, a portion contacting the fluid channel part 300 not only contacts the transmissive thin film parts 150, 250 but also the supports 120, 220, such that the surface reforming methods of the transmissive thin film parts 150, 250 and the supports 120, 220 are completely different from each other, thereby disabling the consistent surface reformation.

The fluid chip 1 according to the first embodiment of the present disclosure may also use the spacer 130 as an electrode for applying a constant current to the fluid sample moving in the fluid channel part 300 as necessary. To this end, a contact point part 217 for connecting with an external electrical supply source may be connected to the other end of the spacer 130, and the contact point part 217 may be formed outside the fluid channel part 300 to facilitate the electrical connection with the external electrical supply source.

FIG. 6 is a diagram showing a process of manufacturing the lower chip 100 according to the first embodiment of the present disclosure.

Referring to FIG. 6A, after cleaning the polished lower substrate 110, the lower support 120 is deposited through low pressure chemical vapor deposition (LPCVD) or the like. At this time, the lower support 120 is preferably deposited on the entire surface as well as on the upper surface 110 *a* of the lower substrate 110 so as to form the lower cover layer 160. The lower support 120 and the lower cover layer 160 may be made of $SiN_x$, $SiO_x$, or the like.

Referring to FIG. 6B, an opening of the lower support 120 is prepared on the lower surface of the lower chip 100 through a dry etching process using a photolithography. In the post-process, the exposed lower substrate 110 is wet etched to form the lower cavity 115.

Referring to FIGS. 6C and 6D, the lower hole part 121 including a plurality of holes which serve as the transmissive window of the electron beam is formed on the lower support 110 positioned on the upper surface of the lower chip 100.

Referring to FIG. 6E, the spacer 210 serving as the thickness of the fluid channel part 300 is formed on the lower support 120 positioned on the upper surface of the lower chip 100 with a component such as metal. At this time, the applicable metal may be gold (Au), platinum (Pt), copper (Cu) or aluminum (Al) which is chemically stable, and is molded in an appropriate form through a process such as lift-off.

Referring to FIG. 6F, the lower cavity 115 is formed by applying an etching process to the lower substrate 110 of the opening. A wet etching may use potassium hydroxide (KOH) solution or tetramethylammonium hydroxide (TMAH) solution. The solution used for the wet etching has a high etching selectivity for silicon, which is a material of the lower substrate 110, and $SiN_x$, which is a material of the lower support 120. Therefore, if the wet etching is used, only the lower substrate 110 made of silicon may be selectively etched. Further, if a dry etching process is used to etch several hundreds of microns, layers made of $SiN_x$ may be destroyed by physical damage occurring during the dry etching process. In conclusion, the wet etching is suitable for etching the lower substrate 110.

Referring to FIG. 6G, the lower transmissive thin film part 150 attached to the lower hole part 121 formed in the lower support 120 of the upper surface of the lower chip 100 is transferred with dry or wet method. At this time, the lower transmissive thin film part 150 may be graphene of a single layer or multiple layers as necessary.

FIG. 7 is a diagram showing a process of manufacturing the upper chip 200 according to the first embodiment of the present disclosure.

Referring to FIG. 7A, after cleaning the polished upper substrate 210, the upper support 220 and the upper cover layer 260 may be deposited. Deposition of the upper support 220 and the upper cover layer 260 may be performed through a low pressure chemical vapor deposition (LPCVD) method. The upper support 220 and the upper cover layer 260 may be preferably made of $SiN_x$, $SiO_x$, or the like.

Referring to FIG. 7B, an opening is prepared on the lower surface of the upper chip 200 through the dry etching process using the photoresist. In the post-process, the opening is etched to form the upper cavity 215.

Referring to FIGS. 7C and 7D, a mask pattern may be formed on the upper support 220 by using a lithography method, and the upper support 220 may be patterned by using the dry etching method. For example, a physical etching method may be inductively coupled plasma-reactive ion etching (ICP-RIE). The upper hole part 221 is formed in the upper support 220 through patterning. A region where the upper hole part 221 has been formed constitutes the upper transmissive window 270.

Referring to FIG. 7E, the upper cavity 215 may be formed in the upper substrate 210 by using the wet etching. The wet etching may use KOH solution or TMAH solution. The solution used for the wet etching has a high etching selectivity for silicon between silicon and $SiN_x$. Therefore, if the wet etching is used, only the upper substrate 210 made of silicon may be selectively etched.

Referring to FIG. 7F, the upper transmissive thin film part 250 may be formed to cover the plurality of upper hole parts 221. The upper transmissive thin film part 250 is preferably a graphene material, and may be transferred with dry or wet method.

Hereinafter, the transmittance of the electron beam for each material of the transmissive thin film part of the fluid chip according to the first embodiment of the present disclosure will be described. For reference, the thicknesses of the supports 120, 220 used in the experiments of FIGS. 8 and 9 below are a level of 100 nanometers, and the thicknesses of the upper and lower transmissive thin film parts 150, 250 are 1 nanometer.

FIG. 8 is an image and a graph showing the transmitted electron intensity for each observing point using the fluid chip 1 according to the first embodiment of the present disclosure. The lower hole part 121 and the upper hole part 221 are arranged in a straight line, and materials of the upper and lower supports 120, 220 are $SiN_x$, and materials of the upper and lower transmissive thin film parts 150, 250 are graphene. As a result, it may be seen that if the electron beam has transmitted the points of the upper and lower supports 120, 220, the transmittance is the lowest, and if the electron beam transmits the points of the upper and lower transmissive thin film parts 150, 250 made of only graphene, the transmittance is the highest.

FIG. 9 is a diagram showing an electron microscope image for each observing point of the fluid chip 1 according to the first embodiment of the present disclosure with respect to the fluid sample in which kaolinite nanorod have been dispersed. It may be confirmed that even if the fluid flows in a fluid cell structure assembled using the fluid chip according to the first embodiment of the present disclosure, the fluid stably flows inside the fluid cell. Likewise, it may be confirmed that if the electron beam has transmitted the points of the transmissive thin film parts 150, 250 of the graphene material, the spatial resolution is superior. In particular, it is more advantageous in a case of analyzing soft materials having a very low contrast ratio between $SiN_x$ (stoichiometric $Si_3N_4$) such as kaolinite ($Al_2Si_2O(OH)_4$). It may be confirmed that as a result of observing with the electron microscope while injecting kaolinite dispersion in real time by using the fluid chip according to the first embodiment of the present disclosure, the rods structure of the kaolinite is shown more clearly at the transmissive thin film part of the graphene material than at the point of the support made of $SiN_x$. As a result of calculating a signal-to-noise ratio of the image under the materials different from each other for its quantitative comparison, it could be confirmed that the graphene region was at least two times brighter than $SiN_x$ region.

The fluid chip 1 according to the first embodiment of the present disclosure may be used not only for the fluid sample but also for observing the precipitation of minerals, intact bio samples, colloidal particles, and the like. FIG. 10 shows the electron micrograph for each electron beam transmissive point of the fluid chip 1 with respect to a gold nanoparticle sample instead of the fluid sample in which the kaolinite rods have been dispersed under the same experimental conditions as in FIG. 9. As before, it may be confirmed that it is the clearest when transmitting only the point of the transmissive thin film part of the graphene material.

FIG. 11 is a diagram showing an image representing the degree of elasticity according to a position of $SiN_x$ by thickness. A size of $SiN_x$ was the same as 40 μm by 200 μm, and the bulging degree for each $SiN_x$ having a thickness of 50 nm, 300 nm, 500 nm was tested. It could be confirmed that the bulging degree of the central portion was greatly reduced (1 μm→30 nm) according to a change in the thickness (50 nm→500 nm) of the $SiN_x$.

As in the related art, the support of the fluid chip of the $SiN_x$ material was also used as the transmissive window, thereby minimizing its bulging effect when thickening the supports, but there was a problem in that the inelastic scattering of the electron beam was increased, thereby reducing the signal-to-noise ratio.

On the other hand, the present disclosure may attach the transmissive thin film parts 150, 250 of the thin two-dimensional material such as graphene by perforating the holes 121, 221 in the supports 120, 220 and use them as the transmissive windows 170, 270 even if the supports 120, 220 made of $SiN_x$ are thick, thereby minimizing the inelastic scattering of the electron beam by the transmissive windows 170, 270 as well as minimizing the bulging effect of the supports 120, 220 to obtain more improved image.

Hereinafter, the fluid chip 1 according to a second embodiment of the present disclosure will be described.

FIG. 12 is an exploded perspective diagram of the upper chip 200 of the fluid chip 1 according to the second embodiment of the present disclosure. As in FIG. 12, the fluid chip 1 according to the present disclosure has one ends of a first electrode 114 and a second electrode 113 having constant electrical conductivity formed in the vicinity thereof including a hole part selected from the upper hole part 221 formed in the upper chip 200 or the lower hole part 121 formed in the lower chip 100 (hereinafter, 'selected hole part'), respectively, and has the respective other ends of the first electrode 114 and the second electrode 113 disposed by extending outward from the fluid channel part 300 for the electrical connection with the external electrical supply source. For reference, FIG. 12 shows a state where the electrodes 114, 113 have been disposed in the upper hole part 221 and the vicinity thereof. Hereinafter, a description will be given on the assumption that the first electrode 114 and the second electrode 113 have been disposed in the upper hole part 221, but as necessary, it is natural that the first electrode 114 and the second electrode 113 may be disposed in the lower hole part 121 and the vicinity thereof.

Further, as necessary, one end of another third electrode 118 may be disposed in the upper hole part 221 in which the first electrode 114 and the second electrode 113 have been disposed and the vicinity thereof, and the other end thereof may be disposed by extending outward from the fluid channel part 300.

If the fluid chip 1 is used for an electric device, the first electrode 114, the second electrode 113, and the third electrode 118 may be used as a counter electrode, an operating electrode, and a reference electrode, respectively, and in this case, the electrodes should not be short-circuited with each other.

In order to observe the electrochemical experiment, particularly, the reduction reaction, a three-electrode system composed of three electrodes is advantageous. At this time, an active material in the fluid sample may be basically attached to one end of the second electrode (operating electrode) 113 extending to an observing region to generate a relative potential difference with the first electrode (counter electrode) 114, thereby occurring the oxidation or the reduction reaction of the corresponding active material. At this time, the third electrode (reference electrode) 118 has the reduction reaction occurring in the fluid sample independently of the first electrode (counter electrode) 114 or the second electrode (operating electrode) 113, and the absolute potential value of the reaction which occurs between the first electrode (counter electrode) 114 and the second electrode (operating electrode) 113 may be specified through the potential measured at this time.

A certain portion including one end of the first electrode 114 may be disposed in a form of partially surrounding the vicinity of the selected upper hole part 221. In FIG. 12, it may be seen that it has been disposed in a form of maintaining the same distance with respect to the upper hole part 221 and surrounding in a C shape. In this case, the first electrode 114 may be present on the same distance in a plane from the active material attached to one end of the second electrode 113, thereby evenly forming a gradient of a constant voltage, that is, an electric field.

One end of the second electrode 113 may be disposed by extending to the upper hole part 221, and this is because the active material attached to one end of the second electrode 113 may extend to the electron beam transmissive region to be easily observed. In this case, if an electrode through hole 131 corresponding to the plurality of holes formed in the upper hole part 221 is formed, it may be easier to observe.

One end of the second electrode 113 may be more preferably disposed between the upper transmissive thin film part 250 and the upper hole part 221, and this is because it is possible to thin the fluid channel of the fluid sample by the thickness of the second electrode 113, thereby enabling better resolution imaging.

Further, one end of the second electrode 113 may be a conductive glassy carbon material, and this is because it is a material capable of easily transmitting the electron beam while having a high affinity with the upper transmissive thin film part 250 which is a two-dimensional material.

The other ends of the first electrode 114, the second electrode 113, and the third electrode 118 are preferably formed with the contact point part 217 having a constant area at a corresponding position so as to be able to easily contact a holder contact point part 530 formed on the lower holder 5 in order to facilitate the electrical connection with the external electrical supply source.

As in FIG. 13, in order for the contact point part 217 formed at one side of the upper chip 200 not to be covered by the lower chip 100, the upper chip 200 of a portion where the contact point part 217 has been formed is preferably arranged in a protruded form because it is larger in size than the lower chip 100. Further, if the upper and lower transmissive thin film parts 250, 150 made of a two-dimensional material cover the contact point part 217, an electrical blocking may occur from a holder external electrode to the contact point or a short circuit may occur between the contact points, such that the upper and lower transmissive thin film parts 250, 150 are preferably transferred only into the fluid channel part 300 from the beginning, and more preferably, the upper and the lower transmissive thin film parts 250, 150 are transferred only to the vicinity of the upper and lower hole parts 221, 121, or entirely transferred and then a necessary portion is preferably removed by using an etching means or the like. Further, if the fluid chip 1 is used for an electric device and the two-dimensional material of the transmissive thin film parts 250, 150 has the electrical conductivity, the respective electrodes are preferably disposed not to be short-circuited with each other by the two-dimensional material, and for example, only the second electrode 113 may be disposed inside the upper transmissive thin film part 250.

Certain portions or more of the first electrode 114, the second electrode 113, and the third electrode 118 may be insulated by an insulation layer 117, and some portions positioned inside the fluid channel part 300 may also be processed not to be insulated by the insulation layer 117 as necessary for the smooth electrochemical reaction.

As shown in FIG. 13, the fluid chip 1 according to the present disclosure is inserted in a space between a holder upper portion 4 and a holder lower portion 5, and lower and upper gasket O-rings 520, 420 may be used for watertight cells. The electron beam irradiated from the TEM may penetrate the holders 4, 5 to reach the fluid sample of the fluid chip 10 because holder through parts 410, 510 formed in each of the holder upper portion 4 and the holder lower portion 5 and the upper and lower cavities 215, 115 of the fluid chip 1 are positioned on the same line.

Since the holder lower portion 5 has the holder contact point part 530 formed on a portion contacting the electrodes 113, 114 formed at one side of the upper chip 200 of the fluid chip 1, the fluid chip 1 receives constant electrical stimulus from the external electrical supply source through an electrical wire 531. Further, the holder lower portion 5 is formed with a fluid injection tube 311, a fluid drainage tube 321, a holder fluid injection part 310, and a holder fluid drainage part 320 for injection and drainage of the fluid sample. The holder lower portion 5 is formed with the fluid injection tube 311, the fluid drainage tube 321, the holder fluid injection part 310, and the holder fluid drainage part 320 for injection and drainage of the fluid sample. The fluid sample is injected from the external fluid injection pump to the holder through the holder fluid injection part 310, and the fluid is delivered to the holder fluid injection part 320 extending to the end, which is the contact point part 217 of the fluid chip 1. Finally, the fluid sample is supplied to the fluid channel part 300 on the fluid chip 1. The fluid sample coming from the fluid chip 1 may be finally delivered to the fluid drainage tube 321 through the holder fluid drainage part 320 to be collected.

Hereinafter, various shapes of the upper chips 200 of the fluid chip 1 according to the second embodiment of the present disclosure will be described with reference to FIG. 14A to 14D. This is to dispose the electrode on the upper chip 200 for ease of explanation, and as necessary, the electrode may also be disposed on the lower chip 100. Further, the fluid chip 1 to be described below is a case which is used for the electric device, and the first electrode 114, the second electrode 113, and the third electrode 118 are referred to as the counter electrode 114, the operating electrode 113, and the reference electrode 118, respectively.

The upper chip 200 shown in FIG. 14A is an embodiment of the most basic electrode arrangement, and since the upper transmissive thin film part 250, which is a conductive two-dimensional material, contacts the operating electrode 113, the reaction occurring around the operating electrode 113 may be observed in real time with high resolution when a current is applied from a fluid electrolyte or the like. At this time, the path of the current proceeds in the order of the operating electrode 113→the upper transmissive thin film part 250→the reactant material→the electrolyte→the counter electrode 114, and if it is the three-electrode system including the reference electrode 118, the reference electrode 118 may be disposed to contact the electrolyte at the outer portion not shown. In the case of FIG. 14, since the operating electrode 113 does not directly contact the fluid sample due to the insulation layer 117, only the upper transmissive thin film part 250 which does not cause the electrochemical reaction contacts the fluid sample, thereby minimizing the influence of other factors in the experiment other than the active material in the case of the secondary cell experiment.

The upper chip 200 shown in FIG. 14B has a form of perforation after the operating electrode 113 is extended to the upper holder part 221, and then disposing the upper transmissive thin film part 250 thereon. At this time, the upper transmissive thin film part 250 may extend to the upper portion of the insulation layer 117 to be disposed so that the fluid and the operating electrode do not directly contact each other in order to minimize the reaction at the operating electrode 113 itself. In this case, the upper transmissive thin film part 250 positioned on the electrode determines the space where the electrolyte is accommodated, and it is possible to thin the thickness of the entire channel, thereby enabling a better high resolution experiment.

FIGS. 14C and 14D show a case of coupling another conductive material 115 to one end of the operating electrode 113. The conductive material may be conductive glassy carbon. In this case, the conductive material 115 has a low electrical conductivity, such that if the entire operating electrode 113 is replaced with the corresponding material, the characteristics of the device is very lowered, but since the physical properties (relatively high electron transmission by low atomic number, good physicochemical affinity and contact with graphene, good electrochemical stability, or low reactivity) are excellent other than the conductivity, the conductive material 115 means a material having an advantage when being disposed on one end of the operating electrode 113. FIG. 14C is a diagram showing an example of exposing one end of the operating electrode 113 to the channel portion, and disposing another conductive material 115 between the upper transmissive thin film part 116 and the operating electrode 113.

FIG. 14D shows a case of disposing the transmissive thin film part 250 on the upper portion of the conductive material 115 of one end of the operating electrode 113 in order to obtain a thin fluid thickness as in FIG. 14B.

Hereinafter, the sequence of manufacturing the upper chip 200 of the fluid chip 1 for the high resolution electron microscope according to an embodiment of the present disclosure will be described with reference to FIGS. 17 to 19. For reference, the arrangement of the electrode may also be possible on the lower chip 100 as necessary, and is not necessarily limited to the process of manufacture to be described below, and it is apparent that some or all of the respective processes may be replaced with another manufacturing means used in a process of manufacturing a general fluid chip and the sequence of each step may be interchanged or omitted at a level of not affecting the result.

Further, the upper chip 200 shown in FIGS. 17 to 19 is shown in FIG. 14A and corresponds to the electric device use. Therefore, as described above, the first electrode 114, the second electrode 113, and the third electrode 118 are referred to as the counter electrode 114, the operating electrode 113, and the reference electrode 118, respectively.

FIG. 17A is the substrate 210, such as a silicon material having both surfaces polished, which is the starting material of the process.

In FIG. 17B, the upper support 220 which serves as an insulating film is deposited on the upper surface and the rear surface of the substrate 210. At this time, the thickness of the upper support 220 operates as the thickness of a support means of the upper transmissive thin film part 250, and may be deposited in a thickness of a unit of several tens of nanometers to several microns, but may be suitable if it is a level of several hundreds of nanometers. At this time, a material of the upper support 220 is a ceramic material such as $SiN_x$ or $SiO_x$ and is suitable if it is a material which is hard enough to maintain the structure when suspended without a support in a unit of several microns and has excellent electrical insulation, chemical resistance, physical rigidity, and the like. The material of the upper support 220 may be made of the same or different materials as necessary.

In FIG. 17C, a portion of the upper support 220 of the lower end which should not be etched is protected by using a photoresist 61 to form the upper cavity 215 in the upper support 220 of the lower end. At this time, a method such as optical lithography or electron beam lithography may be used.

In FIG. 17D, the upper support 220 of the lower end of a region which is not protected by the photoresist 61 is removed by using an apparatus such as inductively coupled plasma (ICP)-reactive ion etching (RIE), and FIG. 17E shows the appearance in which the photoresist has been removed for the post-process.

FIG. 18F shows a process of manufacturing the upper hole part 221 on the upper support 220 of the upper surface, and a portion of the upper support 220 of the upper surface which should not be etched is protected by using the photoresist 62. FIG. 18G shows a process of removing a portion corresponding to the upper hole part 221 of the upper support 220 of the upper surface by using a mechanism such as an ICP-RIE. FIG. 18H shows the appearance having removed a photoresist 62 for the post-process. FIG. 18I shows an image having transferred the upper transmissive thin film part 250 which is a two-dimensional material capable of operating as a portion of the transmissive window or the operating electrode on the upper support 220 of the upper surface. At this time, the upper transmissive thin film part 250 may be conductive or non-conductive and may be generally graphene. The upper transmissive thin film part 250 may be attached to the upper portion of the upper support 220 of the upper surface by using a dry transfer method, a wet transfer method, or the like. FIG. 18J shows a process of removing a material of the upper transmissive thin film part 250 which is present in a portion except for a desired region in order to prevent the side effects such as an electrical short circuit caused by the upper transmissive thin film part 250, and shows a method of peeling, partially burning, and removing it by using laser, physical and chemical etching, plasma, or the like. The method exemplified in the drawing is a method of removing graphene by using high energy plasma such as oxygen having strong straightness, and protects the transmissive window portion by using a shadow mask 63 which plasma may not transmit, and exposes the other portions to the plasma.

FIG. 19 shows one method of depositing the upper transmissive thin film part 250 which is an electrical conductive material in the fluid channel part 300 used as the operating electrode, the counter electrode, the reference electrode, and the like, and shows that all electrodes are deposited at one time with the electrode material of the same material, and each electrode may be also configured differently or omitted by repeating a process corresponding to FIG. 19K to 19M or other methods. The electrode material may be manufactured by various methods or materials according to the user's needs, such as conductive metal, ceramic, conductive polymer, or composite material. FIG. 19K is for using a lift-off method, which is a representative method of the metal deposition processes, and shows a process of protecting a device by using the photoresist 64 in a region where metal should not be deposited on the upper portion of the upper chip 200. FIG. 19I shows a process of depositing a metal thin film entirely on the upper portion, and FIG. 19M is a diagram showing that the metal thin film has been formed at a position where the electrode should be present after a process of by removing a protective film of the photoresist 64 by using solvent or the like to remove a metal residue 641 deposited on the upper portion of the photoresist together. At this time, the thickness of the electrode is preferably deposited thinly because it operates as the channel directly or indirectly to be involved in the thickness of the fluid but is preferably deposited at a level of several tens to several hundreds of nanometers in order to prevent a voltage drop by the resistance as an element constituting an electrical circuit. FIG. 19O shows that the insulation layer 117 is deposited for the passivation or insulating treatment of the electrode. This may prevent the electrode from being exposed directly to the electrolyte to cause secondary reaction or damage to the electrode, and at this time, the insulation layer 117 may be a hard ceramic protective layer or formed of a soft epoxy-based photoresist (for example, SU-8) or the like. The insulation layer 117 is also preferably deposited thinly for the same reason as the electrode but is preferably formed at a level of several tens to several hundreds of nanometers in order to prevent device defects such as the breakdown or short circuit caused by an electric field. FIG. 19P is a diagram showing a process of forming the upper cavity 215 by wet-etching the silicon substrate by using a basic solution or the like with respect to the substrate on which all upper elements have been formed. At this time, KOH, aqueous ammonia, TMAH, or the like may be used as the etchant.

FIGS. 20 to 22 show an exemplary process for representing a process of manufacturing the lower chip 100 of the fluid chip 1, and in the method of manufacturing a target device, it is apparent that some or all of the respective processes may be replaced with another manufacturing means used in a typical electronic device manufacturing process and the sequence of each step may be interchanged or omitted at a level of not affecting the result.

For reference, since the lower chip 100 of the fluid chip 1 according to the present disclosure is commonly used regardless of whether it is an electric element or a heating element, the manufacturing process thereof is also the same.

FIG. 20A shows the lower substrate 110 made of a material, such as silicon having both surfaces polished, which is the starting material of the process. In FIG. 20B, the lower support 120 used as the insulating film of the upper surface and the rear surface of the lower substrate 110 is deposited. At this time, the thickness of the lower support 120 operates as a thickness of supporting the lower transmissive thin film part 150, and may be deposited in a thickness of a unit of several tens of nanometers to several microns, but is suitable if it is several hundreds of nanometers. At this time, a material of the lower support 120 is a ceramic material such as $SiN_x$ or $SiO_x$ and is suitable if it is a material which is hard enough to maintain the structure when suspended without a support by a unit of several microns and has excellent electrical insulation, chemical resistance, physical rigidity, or the like. The materials of the lower supports 120 of the upper surface and the lower surface may consist of the same or different materials as necessary. In FIG. 20C, a portion which should not be etched on the material of the insulating film is protected by using a photoresist 65 on the lower surface in order to form the lower cavity 115 in the lower support 120 of the lower surface. At this time, a method such as optical lithography or electron beam lithography may be used. FIG. 20D shows a process of removing the lower support 120 in a region which is not protected by the photoresist 65 by using an apparatus such as an ICP-RIE. After FIG. 20E, the photoresist is removed for the post-process.

FIG. 21F shows a process of manufacturing the lower hole part 115 to operate as the lower transmissive thin film part 150 on the lower support 120 of the upper surface, and a process of protecting a portion on the lower support 120 of the upper surface which should not be etched by using a photoresist 66. The process of protecting the portion on the lower support 120. FIG. 21G shows a process of removing a portion corresponding to the lower hole part 121 of the lower support 120 of the upper surface by using a mechanism such as an ICP-RIE. FIG. 21H shows after removing the photoresist 66 for the post-process. FIG. 21I is a diagram showing that the lower transmissive thin film part 150, which is a two-dimensional material capable of operating as a portion of the transmissive window or the operating electrode, has been transferred on the lower support 120 of the upper surface. At this time, a material of the lower transmissive thin film part 150 may be conductive or non-conductive and graphene is generally preferred. The lower transmissive thin film part 150 may be attached to the upper portion of the substrate by using a dry transfer method, a wet transfer method, or the like. FIG. 21J shows a process of removing the two-dimensional material existing in a portion except for the desired region in order to prevent the side effects such as the electrical short circuit by the lower transmissive thin film part 150, which is a two-dimensional material, and one of the methods of peeling, partially burning, and removing it by using laser, physical and chemical etching, plasma, or the like. The exemplified method is a method of removing graphene by using high-energy plasma such as oxygen having strong straightness, and protects the transmissive window portion by using a shadow mask 67 through which plasma may not transmit and exposes the other portions to the plasma.

FIG. 22 is one of various methods of forming the spacer 130, and the spacer 130 may be manufactured by various methods or materials according to the user's needs, such as a metal, a ceramic, a polymer, or a composite material. FIG. 22K is for using a lift-off method, which is a representative method of the metal deposition processes, and shows a process of protecting the device by using a photoresist 68 in a region where a metal should not be deposited on the device. FIG. 22L shows a process of depositing a metal thin film entirely on the upper portion, and FIG. 22M is a diagram showing that the metal thin film has been formed at a position where the spacer 130 should be present after a process of removing a protective film of the photoresist 68 by using a solvent or the like to remove a metal residue 681 deposited on the photoresist together. At this time, the spacer 130 is preferably deposited at a level of several tens to several microns. FIG. 22N is a diagram showing a process of forming the lower cavity 115 by wet-etching the silicon substrate by using a basic solution or the like with respect to the substrate on which all upper elements have been formed. At this time, KOH, aqueous ammonia, or TMAH may be used as the etchant.

FIG. 23 is an exploded plane diagram showing before the upper chip 200 and the lower chip 100 manufactured through the manufacturing process are coupled, and the fluid chip 1 may be inserted into an auxiliary mechanism such as a holder.

FIG. 24 is the upper chip 200 of the fluid chip 1 according to a third embodiment of the present disclosure, which may be used as a heating element. As in FIG. 24, the respective one ends of the first electrode 114 and the second electrode 113 are short-circuited with each other to be connected, and therefore, constant current is moved through the first electrode 114 and the second electrode 113. At this time, the first electrode 114 and the second electrode 113 generate constant heat because they are a material having resistance heating property. This enables fine analysis according to the thermochemical reaction of the fluid sample.

The first electrode 114 and the second electrode 113, which have been disposed around the upper hole part 221, used as the heating element may also be positioned inside the upper support 220 except for each end thereof while being short-circuited with each other to be connected, if necessary.

Hereinafter, the sequence of manufacturing the upper chip 200 of the fluid chip 1 for the electron microscope according to the third embodiment of the present disclosure, which may be used as a heating element, will be described with reference to FIGS. 25 to 28. As before, the arrangement of the electrodes may also be possible on the lower chip 2 as necessary, and is not necessarily limited to the process procedures to be described below, and it is apparent that some or all of the respective processes may be replaced with another manufacturing means used in a typical fluid chip manufacturing process and the sequence of each step may be interchanged or omitted at a level of not affecting the result.

FIG. 25A shows the substrate 210 made of a material such as silicon having both surfaces polished, which is the starting material of the process.

In FIG. 25B, the upper support 220 which serves as an insulating film is deposited on the upper surface and the rear surface of the upper substrate 210. At this time, the thickness of the upper support 220 operates as the thickness of a support means of the upper transmissive thin film part 250, and may be deposited in a thickness of a unit of several tens of nanometers to several microns, but is suitable if it is several hundreds of nanometers. At this time, a material of the upper support 220 is a ceramic material such as $SiN_x$ or $SiO_x$, and is suitable if it is a material which is hard enough to maintain the structure when suspended without a support in a unit of several microns and has excellent electrical insulation, chemical resistance, physical rigidity, and the like. The material of the upper support 220 may be made of the same or different materials as necessary.

FIG. 25C to 25E are one of various methods of forming a heating electrode 119 on the upper support 220 of the upper surface, and the heating electrode 119 may be manufactured by various methods or materials according to the user's needs such as metal, nonmetal, ceramic, or composite material having a certain resistance so as to enable resistance heating (so called Joule Heating) due to a current. FIG. 25C is for using the lift-off method, which is a representative method of the metal deposition methods, and shows a process of protecting a device by using a photoresist 81 in a region where a metal should not be deposited on the upper portion. FIG. 25D shows a process of depositing a metal thin film entirely on the upper portion, and FIG. 25E is a diagram showing that the metal thin film has been formed at a position where a heating body should be present after a process of removing a protective film of the photoresist 81 by using a solvent or the like to remove a metal residue 811 deposited on the upper portion of the photoresist together.

FIG. 26F shows that the insulation layer 117 is deposited for the passivation or the insulating treatment of the heating electrode 118 deposited on the upper support 220 of the upper surface. This may prevent the heating electrode 118 from being exposed directly to the electrolyte to cause secondary reaction or damage to the electrode, and at this time, the insulation layer 117 may be a hard ceramic protective layer or formed of a soft epoxy-based photoresist (for example, SU-8), or the like. At this time, since the thickness of the heating electrode 118 or the thickness of the insulation layer 117 does not operate as a channel, it does not affect the thickness of the fluid, such that it is preferably formed at a level of several ten to several hundreds of nanometers which prevents device defects such as insulation breakdown and short circuit as necessary. In FIG. 26G, since the upper cavity 215 should be formed through the etching of the substrate 110 for exposure in order to use the upper support 220 and the insulation layer 117 of the upper surface as a support, a portion which should not be etched on the insulation layer 117 is protected by using a photoresist 82 on the lower end portion in order to form the exposure of the lower portion for starting the etching. At this time, a method such as optical lithography or electron beam lithography may be used. FIG. 26H is a diagram showing a process of removing the upper support 120 in a region which is not protected by the photoresist 82 by using an apparatus such as an ICP-RIE. After FIG. 26I, the photoresist 82 is easily removed for the post-process.

FIG. 27J shows a forming process of manufacturing the upper hole part 221 to operate as a transmissive window of a two-dimensional material, and a process of protecting a portion of the insulation layer 117 which should not etched by using a photoresist 83. FIG. 27K shows a process of removing a portion corresponding to the hole part 221 of the support 220 by using a mechanism such as an ICP-RIE. FIG. 27L shows the appearance after removing the photoresist 83 for the post-process. FIG. 27M is a diagram showing a process of forming the upper cavity 215 by wet-etching the upper substrate 210 by using a basic solution or the like with respect to the substrate where all upper elements have been formed. At this time, KOH, aqueous ammonia, TMAH, or the like may be used as the etchant.

FIG. 28O shows an image of having transferred the upper transmissive thin film part 250, which is a two-dimensional material, operating as a transmissive window on the upper insulation layer 117. At this time, the two-dimensional material may be conductive or non-conductive and graphene is generally preferred. The upper transmissive thin film part 250 may be attached to the upper portion of the upper substrate 210 by using a dry transfer method, a wet transfer method, or the like. FIG. 28P shows a process of removing a portion of the upper transmissive thin film part 250 existing in a portion except for the desired region in order to prevent the side effects such as an electrical short circuit caused by the upper transmissive thin film part 250, and one of the methods of peeling, partially burning, and removing it by using laser, physical and chemical etching, plasma, or the like. The exemplified method is a method of removing graphene by using high-energy plasma such as oxygen having strong straightness, and protects the upper hole part 221 which is a transmissive window by using a shadow mask 84 through which plasma may not transmit and exposes the other portions to the plasma.

As described above, although the embodiments of the present disclosure have been described with reference to the accompanying drawings, those skilled in the art to which the present disclosure pertains may understand that the present disclosure may be embodied in other specific forms without changing the technical spirit or the essential features thereof. Therefore, it should be understood that the described embodiments are illustrative in all respects and are not limitative.

What is claimed is:

1. A fluid chip for an electron microscope comprising a lower chip, an upper chip, and a fluid channel part for supplying a fluid sample, comprising:
    wherein the lower chip comprises a lower substrate having a lower cavity formed therein; a lower support deposited on the upper surface of the lower substrate, the lower support having a plurality of holes formed in a region of the lower cavity; a spacer positioned at both ends of the lower support; and a lower transmissive thin film part attached on the lower support to cover the lower support,
    wherein the upper chip comprises an upper substrate having an upper cavity formed therein; an upper support deposited on the upper surface of the upper substrate, the upper support having a plurality of holes formed in a region of the upper cavity; and an upper transmissive thin film part attached on the upper support to cover the upper support, and
    wherein the fluid channel part is formed by stacking the upper support disposed on the upper surface of the upper substrate on the spacer of the lower chip, and the transmissive thin film part is positioned inside the fluid channel part,
    wherein the fluid channel part is surrounded by only the transmissive thin film part and the spacer,
    wherein the upper chip is stacked on the lower chip in an inverted state.

2. The fluid chip for the electron microscope of claim 1, wherein the plurality of upper holes and the plurality of lower holes are positioned on a straight line.

3. The fluid chip for the electron microscope of claim 1, wherein the upper transmissive thin film part or the lower transmissive thin film part comprises a two-dimensional material.

4. The fluid chip for the electron microscope of claim 3, wherein the two-dimensional material layer is at least any one from the group consisting of graphene, borophen, transition metal dichalcogenide (TMDC), and hexagonal-boron nitride (BN).

5. The fluid chip for the electron microscope of claim 1, wherein the upper transmissive thin film part or the lower transmissive thin film part is transferred and attached in a dry or wet method.

6. The fluid chip for the electron microscope of claim 1, wherein the upper substrate or the lower substrate is a silicon material.

7. The fluid chip for the electron microscope of claim 1, wherein the upper support or the lower support is a silicon nitride or silicon oxide material.

8. The fluid chip for the electron microscope of claim 1, wherein the spacer is a metal, ceramic, or polymer material.

9. The fluid chip for the electron microscope of claim 1, wherein a contact point part for the connection with an electrical supply source is formed on the other end of the spacer outside the fluid channel part, in order to apply a constant current to the fluid sample in the fluid channel part.

10. A fluid chip for an electron microscope comprising a lower chip, an upper chip, and a fluid channel part for supplying a fluid sample, comprising:
    wherein the lower chip comprises a lower substrate having a lower cavity formed therein; a lower support deposited on the upper surface of the lower substrate, the lower support having a plurality of holes formed in a region of the lower cavity; a pair of spacers positioned on the lower support; and a lower transmissive thin film part attached on the lower support to cover the lower support,
    wherein the upper chip comprises an upper substrate having an upper cavity formed therein; an upper support deposited on the upper surface of the upper substrate, the upper support having a plurality of holes formed in a region of the upper cavity; and an upper transmissive thin film part attached on the upper support to cover the upper support, and
    wherein the fluid channel part is formed by stacking the upper support disposed on the upper surface of the upper substrate on the pair of spacers of the lower chip, and the transmissive thin film part is positioned inside the fluid channel part,
    wherein the upper chip is stacked on the lower chip in an inverted state,
    wherein the pair of spacers is positioned between the lower support and the upper support.

11. A fluid chip for an electron microscope of claim 10, wherein the pair of spacers is configured to define the fluid channel such that the fluid sample flows, along and between the pair of spacers, through the fluid channel.

* * * * *